(12) United States Patent
Noda et al.

(10) Patent No.: US 8,704,253 B2
(45) Date of Patent: Apr. 22, 2014

(54) LIGHT-EMITTING DEVICE AND ORGANIC ELECTROLUMINESCENCE LIGHT-EMITTING DEVICE

(75) Inventors: Susumu Noda, Kyoto (JP); Takashi Asano, Kyoto (JP); Masayuki Fujita, Kyoto (JP); Hiroshi Ohata, Tokyo (JP)

(73) Assignee: Rohm Co., Ltd., Kyoto (JP)

( * ) Notice: Subject to any disclaimer, the term of this patent is extended or adjusted under 35 U.S.C. 154(b) by 1630 days.

(21) Appl. No.: 10/550,653

(22) PCT Filed: Mar. 19, 2004

(86) PCT No.: PCT/JP2004/003724
§ 371 (c)(1),
(2), (4) Date: Nov. 15, 2006

(87) PCT Pub. No.: WO2004/086821
PCT Pub. Date: Oct. 7, 2004

(65) Prior Publication Data
US 2007/0120136 A1    May 31, 2007

(30) Foreign Application Priority Data
Mar. 25, 2003 (JP) ................................. 2003-083375

(51) Int. Cl.
*H01L 33/00* (2010.01)
(52) U.S. Cl.
USPC .................... 257/98; 257/40; 438/27; 438/99
(58) Field of Classification Search
USPC ................................... 257/98, 40; 438/27, 99
See application file for complete search history.

(56) References Cited

U.S. PATENT DOCUMENTS 6,670,772 B1 * 12/2003 Arnold et al. ............... 315/169.3
6,704,335 B1 *  3/2004 Koyama et al. ............ 372/43.01
(Continued)

FOREIGN PATENT DOCUMENTS

JP    11-084117    3/1999
JP    11-283751   10/1999
(Continued)

OTHER PUBLICATIONS

Yamasaki et al. "Organic light-emitting device with an ordered monolayer of silica microspheres as a scattering medium", Applied Physics Letters, vol. 76, No. 10, pp. 1243-1245 2000.

(Continued)

*Primary Examiner* — Mark Tornow
(74) *Attorney, Agent, or Firm* — Oblon, Spivak, McClelland, Maier & Neustadt, L.L.P.

(57) ABSTRACT

In conventional organic EL light-emitting devices, the ITO used for a transparent electrode has a refractive index of about 2.0 larger than the refractive index of 1.5 of a transparent glass substrate. As a result, the mode of most of light traveling from the transparent electrode toward the glass substrate is the transparent electrode guided mode, and no light is emitted from the transparent electrode toward the glass substrate. According to the invention, the light extraction efficiency of conventional light-emitting devices such as organic EL light-emitting devices is improved by using mode conversion means so as to solve the problem that conventional light-emitting devices such as organic EL light-emitting devices have low light extraction efficiencies. A light-emitting device of the invention comprises a light-emitting layer on a substrate and mode conversion means for converting the mode from the guided mode into an emission mode. The mode conversion means is provided in the substrate, in the light-emitting layer, or at the interface between the substrate and the light-emitting layer.

21 Claims, 57 Drawing Sheets

(56) References Cited

U.S. PATENT DOCUMENTS

| | | | |
|---|---|---|---|
| 6,833,667 B2 * | 12/2004 | Hamano et al. | 313/504 |
| 2001/0035713 A1 * | 11/2001 | Kimura | 313/501 |
| 2001/0038102 A1 * | 11/2001 | Kawase | 257/98 |
| 2002/0018620 A1 * | 2/2002 | Koyama et al. | 385/37 |
| 2002/0030442 A1 * | 3/2002 | Koyama et al. | 313/504 |
| 2004/0012980 A1 * | 1/2004 | Sugiura et al. | 362/560 |
| 2004/0161192 A1 * | 8/2004 | Hamano et al. | 385/31 |

FOREIGN PATENT DOCUMENTS

| | | |
|---|---|---|
| JP | 11-329740 | 11/1999 |
| JP | 2001-230069 | 8/2001 |
| JP | 2002-75656 | 3/2002 |
| JP | 2002-204024 | 7/2002 |
| JP | 2002-231443 | 8/2002 |
| JP | 2002-260845 | 9/2002 |
| JP | 2002-313562 | 10/2002 |
| JP | 2003-029654 | 1/2003 |
| JP | 2003-115377 | 4/2003 |
| JP | 2003-163075 | 6/2003 |
| JP | 2004-128445 | 4/2004 |
| WO | WO 0036664 A2 * | 6/2000 |
| WO | WO 00/78102 A1 | 12/2000 |

OTHER PUBLICATIONS

Lupton et al. "Bragg scattering from periodically microstructured light emitting diodes", Applied Physics Letters, vol. 77, No. 21, pp. 3340-3342 2000.

Office Action issued Jul. 6, 2010, in Japanese Patent Application No. 2004-077446 (with English-language translation).

Office Action issued Oct. 5, 2010, in Japanese Patent Application No. 2004-077446 (with English-language translation).

* cited by examiner

LIGHT-EMITTING DEVICE AND ORGANIC ELECTROLUMINESCENCE LIGHT-EMITTING DEVICE

TECHNICAL FIELD

This invention relates to a light-emitting device having a high light extraction efficiency, or in particular to an organic electroluminescence (hereinafter referred to as EL) light-emitting device having a high light extraction efficiency for the light emitted from an organic EL layer.

BACKGROUND ART

The organic EL light-emitting device is a highly promising self luminous element for use as a video display device such as a display and a surface light source. The organic EL light-emitting device is used for a video display device either as a part color system to emit a monochromatic light or as a full color system having areas to emit light in the three primary colors of red (R), green (G) and blue (B). The organic EL light-emitting device used as a surface light source is configured as a thin-film device.

This organic EL light-emitting device is fabricated generally by laminating a transparent electrode constituting an anode, an organic EL layer and a metal electrode constituting a cathode in that order on a transparent substrate such as a glass substrate. By the voltage applied between the transparent electrode and the metal electrode, the electrons supplied from the cathode and the holes supplied from the anode are recombined in the organic EL layer. With the recombined, excitons are generated and during the transition of the excitons from the excited state to the normal state, the EL light is emitted. The EL light thus emitted is transmitted through the transparent electrode and extracted externally from the transparent substrate.

The light extraction efficiency of this organic EL light-emitting device is expected to be low. Specifically, the refractive index of ITO (indium tin oxide) used as the transparent electrode is about 2.0 higher than the refractive index 1.5 of the glass substrate used as the transparent substrate. Therefore, the greater proportion of the light proceeding toward the glass substrate from the transparent electrode becomes a transparent electrode waveguide mode propagates through the neighborhood of the transparent electrode and fails to be radiated to the glass substrate from the transparent electrode. FIG. 1 shows the result of simulation of the electric field distribution in the transparent electrode waveguide mode trapped in the transparent electrode. In FIG. 1, in accordance with the distance from the metal electrode, the refractive index distributions of the ITO and the glass substrate are indicated by dashed lines following Alq3 and PVK making up an organic EL layer, while the field intensity in the transparent electrode waveguide mode of the light having the light emission wavelength of 524 nm is indicated by solid line. As understood from FIG. 1, although the exudation of about the effective wavelength is observed, the transparent electrode waveguide mode is trapped by the ITO high in refractive index and cannot be extracted externally.

Further, as compared with the refractive index 1.0 of air, the refractive index of the glass substrate is as high as about 1.5. Therefore, the transparent substrate waveguide mode prevails, in which the greater proportion of the light proceeding toward the glass substrate from the transparent electrode propagates through the glass substrate and fails to be radiated into the air from the glass substrate. As a result, the greater proportion of the light emitted from the organic EL layer assumes the transparent electrode waveguide mode or the transparent substrate waveguide mode, thereby reducing the light extraction efficiency.

Incidentally, in this application, the light extraction efficiency is defined as the ratio of photons capable of being extracted out of the organic EL light-emitting device to the photons emitted as light from the organic EL layer.

Also, in this application, the waveguide mode is defined as the state of the electromagnetic wave propagating through a waveguide, and the radiation mode is defined as the state of the electromagnetic wave not locally existent in the waveguide.

The actual light extraction efficiency is difficult to measure. For calculation thereof, therefore, simulation is unavoidably resorted to. In view of the fact that the thickness of the transparent electrode and the organic EL layer are equal to or smaller than the effective wavelength of the light emitted from the organic EL layer, and a simple method using the geometrical optics is known to develop a considerable error. In addition to the geometrical optics, therefore, various calculation methods have been tried. As the result of simulation using the finite time domain difference method, the present inventors have made it clear that even in the case where the thickness of the transparent electrode is changed from 50 nm to 200 nm and the thickness of the organic EL layer from 20 nm to 80 nm, the transparent electrode waveguide mode remains about 40 to 50% and the transparent substrate waveguide mode about 25 to 35% of the light emitted from the organic EL layer, so that the light extraction efficiency of the light emitted from the glass substrate is about 15 to 30%.

Incidentally, in this application, the effective wavelength is defined as the wavelength of the light in a propagation medium, and expressed as Effective wavelength=wavelength in vacuum/refractive index of propagation medium In the prior art, as a method to improve the light extraction efficiency of the organic EL light-emitting device, a technique is disclosed in which a condensing lens is arranged in the boundary between the transparent electrode and the transparent substrate (See Patent Document 1, for example). The prior art with the condensing lens arranged in the boundary between the transparent electrode and the transparent substrate is shown in FIG. 2. Numeral 81 denotes a glass substrate, 82 a transparent electrode, 83 an organic EL layer and 84 a condensing lens. This has such a structure that the angle of incidence of that part of the light emitted from the organic EL layer 83 which is totally reflected is converted into a small angle by a plurality of condensing lenses 84 providing a light angle conversion means thereby to extract the light.

As shown in FIG. 2, however, in the case where the condensing lens 84 formed on the upper surface of the glass substrate 81 is used, the ratio of the light from the organic EL layer 83 immediately under the center of the condensing lens 84 (point A in FIG. 2) which is totally reflected can be decreased, whereas the ratio of the light from the organic EL layer 83 not immediately under the lens center (point B in FIG. 2) which is totally reflected is rather increased. (Patent Document 1: Japanese laid-open Publication No. 2002-260845)

DISCLOSURE OF THE INVENTION

From the result of simulation of the light extraction efficiency, the present inventors have took note of the fact that the great proportion of the light emitted from the organic EL layer comes to assume the transparent electrode waveguide mode or the transparent substrate waveguide mode. Specifically, the light extraction efficiency is improved by converting the transparent electrode waveguide mode to the radiation mode in which the light is radiated from the transparent electrode to the transparent substrate, or by converting the transparent substrate waveguide mode to the radiation mode in which the light is radiated outside from the transparent substrate.

In view of this, the present inventors have invented a mode conversion means for converting the transparent electrode waveguide mode or the transparent substrate waveguide mode constituting a waveguide mode into the radiation mode using the behavior of the light wave. The object of this invention is to obviate the low light extraction efficiency of the conventional organic EL light-emitting device and other light-emitting devices and improve the light extraction efficiency from the light-emitting device such as the organic EL light-emitting device using the mode conversion means.

Means for Solving the Problem

The basic principle of the invention to achieve the object described above is explained with reference to FIG. 3. In FIG. 3, numeral 11 denotes a substrate, 12 a light-emitting layer, 21 a radiation mode, 22 a waveguide mode, 23 a radiation mode, and 24 a waveguide mode. The light-emitting layer 12 is formed on the substrate 11, and the light emitted from the light-emitting layer 12 is emitted outside through the substrate 11. The substrate 11 is generally higher in refractive index than the external air, and therefore, in the case where the angle of incidence to the external air from the substrate 11 is not higher than the critical angle, the light emitted from the light emitting layer 12 is radiated outside as a radiation mode 21. In the case where the angle of incidence from the substrate 11 to the external air is not lower than the critical angle, however, the light is totally reflected on the boundary between the substrate 11 and the external air and assumes the waveguide mode 22.

In view of this, a mode conversion means for converting the waveguide mode to the radiation mode is arranged in the area where the light assuming the waveguide mode is propagated. In FIG. 3, a regularity of a refractive index distribution is formed in the boundary between the substrate 11 and the light-emitting layer 12. In the case where the refractive index of the substrate 11 is 1.5 and the refractive index of the light-emitting layer 12 is 1.7, i.e. in the case where these two refractive indexes are different from each other, for example, the regularity of the refractive index distribution can be formed simply by forming an unevenness in the boundary between the substrate 11 and the light-emitting layer 12. In the case where the unevenness thus formed has such a period as to prohibit the propagation of the light assuming the waveguide mode, the waveguide mode 22 is ideally converted totally into the radiation mode 23. Actually, however, it is difficult to achieve the refractive index distribution to totally prohibit the propagation, and therefore the propagation of a part of the waveguide mode 22 is suppressed from being converted to the radiation mode 23. Thus, a part of the waveguide mode 22 is left as the waveguide mode 24 without being converted.

Specifically, according to a first aspect of the invention, there is provided a light-emitting device comprising at least a light-emitting layer on a substrate, wherein a mode conversion means for converting the waveguide mode to the radiation mode is arranged in at least one of the interior of the substrate, the interior of the light-emitting layer, the boundary between the substrate and the exterior thereof, the boundary between the substrate and the light-emitting layer and the boundary between the light-emitting layer and the exterior thereof.

As an alternative, in the case of a light-emitting device having at least a light-emitting layer and one or more waveguide layers on a substrate, a mode conversion means for converting the waveguide mode to the radiation mode is arranged in at least one of the interior of the substrate, the interior of the light-emitting layer, the interior of the waveguide layer, the boundary between the substrate and the exterior of the substrate, the boundary between the substrate and the light-emitting layer, the boundary between the light-emitting layer and the exterior of the light-emitting layer, the boundary between the substrate and the waveguide layer, the boundary between the light-emitting layer and the waveguide layer, the boundary between the waveguide layer and the exterior of the waveguide layer and the boundary between the waveguide layer and the waveguide layer.

In the conventional light-emitting device, part of the light emitted from the light-emitting layer is converted into the radiation mode and radiated outside, while the remainder assumes the waveguide mode. According to the first aspect of the invention, however, the light that has assumed the waveguide mode is also converted into the radiation mode by the mode conversion means and radiated out of the light-emitting device. Therefore, the light extraction efficiency of the light-emitting device can be improved.

According to a second aspect of the invention, there is provided an organic EL light-emitting device comprising at least a first electrode, an organic EL layer and a second electrode opposed to the first electrode, arranged in that order on a substrate, wherein a mode conversion means for converting the waveguide mode to the radiation mode is arranged in at least one of the interior of the substrate, the interior of the first electrode, the interior of the organic EL layer, the interior of the second electrode, the boundary between the substrate and the exterior of the substrate, the boundary between the substrate and the first electrode, the boundary between the first electrode and the organic EL layer, the boundary between the organic EL layer and the second electrode and the boundary between the second electrode and the exterior of the second electrode.

As another alternative, there is provided an organic EL light-emitting device comprising at least a first electrode, an organic EL layer and a second electrode opposed to the first electrode, arranged in that order on a substrate, wherein at least one waveguide layer is formed on the substrate, and wherein a mode conversion means for converting the waveguide mode to the radiation mode is arranged in at least one of the interior of the substrate, the interior of the first electrode, the interior of the organic EL layer, the interior of the second electrode, the interior of the waveguide layer, the boundary between the substrate and the exterior of the substrate, the boundary between the substrate and the first electrode, the boundary between the first electrode and the organic EL layer, the boundary between the organic EL layer and the second electrode, the boundary between the second electrode and the exterior of the second electrode, the boundary between the substrate and the waveguide layer, the boundary between the first electrode and the waveguide layer, the boundary between the organic EL layer and the waveguide layer, the boundary between the second electrode and the waveguide layer, the boundary between the waveguide layer and the exterior of the waveguide layer and the boundary between the waveguide layer and the waveguide layer.

In the conventional organic EL light-emitting device, part of the light emitted from the organic EL light-emitting layer is converted into the radiation mode and radiated out of the organic EL light-emitting device, while the remainder assumes the waveguide mode. According to the second aspect of the invention, however, the light that has assumed the waveguide mode is also converted into the radiation mode by the mode conversion means and radiated out of the organic EL light-emitting device. Therefore, the light extraction efficiency of the organic EL light-emitting device is improved.

The organic EL layer may include a hole injection layer, a hole transport layer, an organic EL light-emitting layer, an electron injection layer and an electron transport layer. The hole injection layer has the function to facilitate the hole injection from the hole injection electrode, and the hole transport layer has the function to transport the holes stably. The electron injection layer has the function to facilitate the electron injection from the electron injection electrode, and the electron transport layer the function to transport the electrons stably. These layers increase the holes and the electrons injected into the organic EL light-emitting layer and exhibits the trap effect to improve the light emission efficiency. The organic EL light-emitting layer contains a fluorescent material as a chemical compound having the light-emitting function and emits light by the EL phenomenon. This is also the case with the description that follows.

The waveguide layer means not a material or a structure, but a layer in which the light emitted from the organic EL layer assumes the waveguide mode. Especially, in the case where the refractive indexes of the layers on adjacent sides are relatively low, the surface in contact with the two layers reflects the light over the critical angle and therefore is liable to assume the waveguide layer. This is also the case with the description that follows.

The light-emitting device according to the second aspect of the invention also includes an organic EL light-emitting device characterized in that the second electrode is a transparent electrode, a thin metal electrode or an electrode constituting of the transparent electrode and a thin film which arranged on the transparent electrode at the side of the organic EL layer.

By forming the second electrode of a transparent electrode, the organic EL light-emitting device of what is called the top emission type is realized in which the light emitted from the organic EL layer can be extracted from the side far from the substrate. The second electrode may be formed of a thin metal electrode to improve the translucency. By setting the second electrode on the anode side, the holes can be easily injected even in the case where the second electrode is a transparent electrode. In the case where the second electrode is formed on the cathode side, on the other hand, injection of electrons becomes difficult even in the case where the second electrode is a transparent electrode. This inconvenience is obviated by forming a thin metal film facilitating the electron injection between the transparent electrode and the organic EL layer.

The light-emitting device according to the second aspect of the invention also includes an organic EL light-emitting device characterized in that an optical function layer having a mode conversion means for converting the waveguide mode to the radiation mode is arranged on the outer surface of the substrate or the outer surface of the second electrode.

By providing the optical function layer having the mode conversion means for converting the waveguide mode to the radiation mode on the outer surface of the substrate, that part of the light emitted from the organic EL layer which proceeds toward the substrate and may assume the waveguide mode is converted to the radiation mode, and radiated out of the organic EL light-emitting device. This light-emitting device, therefore, is effectively applicable as an organic EL light-emitting device of what is called the bottom emission type in which the light emitted from the organic EL layer is extracted from the substrate side. Also, in the case where the optical function layer having the mode conversion means for converting the waveguide mode to the radiation mode is formed on the outer surface of the second electrode, that part of the light emitted from the organic EL layer which proceeds toward the second electrode and may assume the waveguide mode is converted to the radiation mode and radiated out of the organic EL light-emitting device. This light-emitting device is effectively applicable as an organic EL light-emitting device of what is called the top emission type in which the light emitted from the organic EL layer is extracted from the side opposite to the substrate. Thus, the light extraction efficiency of the organic EL light-emitting device is improved. The mode conversion means is arranged in the interior of the optical function layer or the boundary of the optical function layer.

The optical function layer is defined as a layer which is formed of a material through which the light emitted from the organic EL layer is transmitted and which includes, in the interior or the boundary thereof, a mode conversion means for converting the waveguide mode to the radiation mode. The waveguide layer including a mode conversion means as a part thereof for converting the waveguide mode to the radiation mode can function as an optical function layer.

According to a third aspect of the invention, there is provided an organic EL light-emitting device comprising at least a first electrode, an organic EL layer, a translucent second electrode opposed to the first electrode and a protective film, arranged in that order on a substrate, wherein a mode conversion means for converting the waveguide mode to the radiation mode is arranged in at least one of the interior of the substrate, the interior of the first electrode, the interior of the organic EL layer, the interior of the second electrode, the interior of the protective film, the boundary between the substrate and the exterior of the substrate, the boundary between the substrate and the first electrode, the boundary between the first electrode and the organic EL layer, the boundary between the organic EL layer and the second electrode, the boundary between the second electrode and the protective film and the boundary between the protective film and the exterior of the protective film.

As an alternative, there is provided an organic EL light-emitting device comprising at least a first electrode, an organic EL layer, a translucent second electrode opposed to the first electrode and a protective film, arranged in that order on a substrate, wherein at least one waveguide layer is formed on the substrate, and wherein a mode conversion means for converting the waveguide mode to the radiation mode is arranged in at least one of the interior of the substrate, the interior of the first electrode, the interior of the organic EL layer, the interior of the second electrode, the interior of the protective film, the interior of the waveguide layer, the boundary between the substrate and the exterior of the substrate, the boundary between the substrate and the first electrode, the boundary between the first electrode and the organic EL layer, the boundary between the organic EL layer and the second electrode, the boundary between the second electrode and the protective film, the boundary between the protective film and the exterior of the protective film, the boundary between the substrate and the waveguide layer, the boundary between the first electrode and the waveguide layer, the boundary between the organic EL layer and the waveguide layer, the boundary between the second electrode and the waveguide layer, the boundary between the protective film and the waveguide layer, the boundary between the waveguide layer and the exterior of the waveguide layer and the boundary between the waveguide layer and the waveguide layer.

In the case of the organic EL light-emitting device of what is called the top emission type in which the second electrode is a translucent electrode and the light emitted from the organic EL layer is extracted from the side far from the substrate, a protective film is preferably arranged on the side of the second electrode. The protective film is expected to prevent the contact with the second electrode and prevent the oxidization of the organic EL layer. By providing the mode conversion means also in the interior of the protective film and in the boundary of the protective film, the light which has assumed the waveguide mode is also converted to the radiation mode and radiated out of the organic EL light-emitting device. Thus, the light extraction efficiency of the organic EL light-emitting device is improved.

The light-emitting device according to the third aspect of the invention also comprises an organic EL light-emitting device characterized by including, on the outer surface of the substrate or the outer surface of the protective film, an optical function layer having a mode conversion means for converting the waveguide mode to the radiation mode.

By providing the optical function layer having the mode conversion means for converting the waveguide mode to the radiation mode on the outer surface of the substrate, that part of the light emitted from the organic EL layer which proceeds toward the substrate and may assume the waveguide mode is converted to the radiation mode, and radiated out of the organic EL light-emitting device. This light-emitting device, therefore, is effectively applicable as an organic EL light-emitting device of what is called the bottom emission type in which the light emitted from the organic EL layer is extracted from the substrate side. Also, in the case where the optical function layer having the mode conversion means for converting the waveguide mode to the radiation mode is formed on the outer surface of the protective film, that part of the light emitted from the organic EL layer which proceeds toward the protective film and may assume the waveguide mode is converted to the radiation mode and radiated out of the organic EL light-emitting device. This light-emitting device is effectively applicable as an organic EL light-emitting device of what is called the top emission type in which the light emitted from the organic EL layer is extracted from the side far from the substrate. Thus, the light extraction efficiency of the organic EL light-emitting device is improved. The mode conversion means is arranged in the interior of the optical function layer or the boundary of the optical function layer.

According to a fourth aspect of the invention, there is provided an organic EL light-emitting device comprising at least a transparent electrode, an organic EL layer and a metal electrode opposed to the transparent electrode, arranged in that order on a transparent substrate, wherein a mode conversion means for converting the waveguide mode to the radiation mode is arranged in at least one of the interior of the transparent substrate, the interior of the transparent electrode, the interior of the organic EL layer, the interior of the metal electrode, the boundary between the transparent substrate and the exterior of the transparent substrate, the boundary between the transparent substrate and the transparent electrode, the boundary between the transparent electrode and the organic EL layer, the boundary between the organic EL layer and the metal electrode and the boundary between the metal electrode and the exterior of the metal electrode.

As an alternative, there is provided an organic EL light-emitting device comprising at least a transparent electrode, an organic EL layer and a metal electrode opposed to the transparent electrode, arranged in that order on a transparent substrate, wherein at least one waveguide layer is formed on the transparent substrate, and wherein a mode conversion means for converting the waveguide mode to the radiation mode is arranged in at least one of the interior of the transparent substrate, the interior of the transparent electrode, the interior of the organic EL layer, the interior of the metal electrode, the interior of the waveguide layer, the boundary between the transparent substrate and the exterior of the transparent substrate, the boundary between the transparent substrate and the transparent electrode, the boundary between the transparent electrode and the organic EL layer, the boundary between the organic EL layer and the metal electrode, the boundary between the metal electrode and the exterior of the metal electrode, the boundary between the transparent substrate and the waveguide layer, the boundary between the transparent electrode and the waveguide layer, the boundary between the organic EL layer and the waveguide layer, the boundary between the metal electrode and the waveguide layer, the boundary between the waveguide layer and the exterior of the waveguide layer and the boundary between the waveguide layer and the waveguide layer.

In the conventional organic EL light-emitting device, part of the light emitted from the organic EL light-emitting layer is converted into the radiation mode and radiated outside of the organic EL light-emitting device, while the remainder assumes the waveguide mode. According to the fourth aspect of the invention, however, the light that has assumed the waveguide mode is also converted into the radiation mode by the mode conversion means and radiated out of the organic EL light-emitting device. Therefore, the light extraction efficiency of the organic EL light-emitting device is improved.

The light-emitting device according to the fourth aspect of the invention includes an organic EL light-emitting device characterized by further comprising, on the outer surface of the transparent substrate or the outer surface of the metal electrode, an optical function layer having a mode conversion means for converting the waveguide mode to the radiation mode.

By providing the optical function layer having the mode conversion means for converting the waveguide mode to the radiation mode on the outer surface of the transparent substrate, that part of the light emitted from the organic EL layer which proceeds toward the transparent substrate and may assume the waveguide mode is converted to the radiation mode, and radiated out of the organic EL light-emitting device. This light-emitting device is effectively applicable as an organic EL light-emitting device of what is called the bottom emission type in which the light emitted from the organic EL layer is extracted from the transparent substrate side. Also, in the case where the optical function layer having the mode conversion means for converting the waveguide mode to the radiation mode is formed on the outer surface of the metal electrode, that part of the light emitted from the organic EL layer which proceeds toward the metal electrode and may assume the waveguide mode is converted to the radiation mode and radiated out of the organic EL light-emitting device. This light-emitting device is effectively applicable as an organic EL light-emitting device of what is called the top emission type in which the light emitted from the organic EL layer is extracted from the side far from the transparent substrate. Thus, the light extraction efficiency of the organic EL light-emitting device is improved. The mode conversion means is arranged in the interior of the optical function layer or the boundary of the optical function layer.

The waveguide mode in this invention includes the transparent electrode waveguide guide for propagating the light through the transparent electrode and the transparent substrate waveguide mode. The transparent electrode waveguide mode includes the waveguide mode integrated with the interior of the organic EL layer as well as the transparent electrode. This is by reason of the fact that the thickness of the transparent electrode and the thickness of the organic EL layer are smaller than the effective wavelength and the exudation occurs from the transparent electrode to the organic EL layer and the transparent substrate, so that the propagation is not strictly limited to the interior of the transparent electrode. The transparent substrate waveguide mode is a waveguide mode in which the field intensity is strongest mainly in the transparent substrate. This is also the case with the description of the invention that follows.

The conversion from the waveguide mode to the radiation mode according to the invention described above includes the conversion from the waveguide mode of an inner layer to the waveguide mode of an outer layer in the case where the refractive index of the inner layer is higher than that of the outer layer. This is by reason of the fact that the waveguide mode of the inner layer, though converted in mode and partly radiated through the outer layer, partly assumes the waveguide mode of the outer layer. In the case where the refractive index of the transparent electrode is 2.0, the refractive index of the transparent substrate is 1.5 and the refractive index of the exterior of the transparent substrate is 1.0, for example, the conversion from the transparent electrode waveguide mode to the radiation mode includes the conversion from the transparent electrode waveguide mode to the radiation mode followed by external radiation through the transparent substrate on the one hand and the conversion from the transparent electrode waveguide mode to the radiation mode followed by the radiation into the transparent substrate in which the transparent electrode waveguide mode for propagation in the transparent substrate is converted to the radiation mode on the other hand. This is also the case with the description of the invention that follows.

According to a fifth aspect of the invention, there is provided an organic EL light-emitting device of the first to fourth aspects of the invention, characterized in that the mode conversion means is an optical structure having a regularity of a refractive index distribution in the one-dimensional, two-dimensional or the three-dimensional direction.

The optical structure having the regularity of the refractive index distribution in the one-dimensional, two-dimensional or the three-dimensional direction according to the fifth aspect of the invention improves the light extraction efficiency of the organic EL light-emitting device.

According to another aspect of the invention, there is provided an organic EL light-emitting device of the fifth aspect of the invention, characterized in that the regularity is the period of the effective wavelength degree of the light emitted from the organic EL layer.

The period of the effective wavelength degree makes possible effective interference with the light emitted from the organic EL layer and improves the light extraction efficiency of the organic EL light-emitting device.

In this application, the effective wavelength degree is defined as the length one fourth to five times as long as the effective wavelength.

According to another aspect of the invention, there is provided an organic EL light-emitting device of the aforementioned aspect of the invention, characterized in that the organic EL light-emitting device includes two or more mode conversion means having the regularity of the same period.

With the organic EL light-emitting device having two or more mode conversion means, in more than one layer, the waveguide mode is converted sequentially to radiation mode thereby to improve the light extraction efficiency of the organic EL light-emitting device.

According to another aspect of the invention, there is provided an organic EL light-emitting device of the fifth aspect of the invention, characterized in that the regularity is has a fluctuation of not more than one fourth of the period of the effective wavelength degree of the light emitted from the organic EL layer.

The provision of the regularity with the period and the fluctuation makes it possible to effectively interfere with the light having a spread of wavelength emitted from the organic EL layer thereby to improve the light extraction efficiency of the organic EL light-emitting device. Also, the light from the organic EL light-emitting device can be emitted at a wide angle without being limited to a specified direction thereby to relax the directivity.

According to another aspect of the invention, there is provided an organic EL light-emitting device of the aforementioned aspect of the invention, characterized in that the mode conversion means has at least two optical structures with a refractive index distribution having a regularity in the two-dimensional direction, and the optical structures have different periods within the fluctuation range.

The optimum structure can be selected for mode conversion from the waveguide mode to the radiation mode for each layer, and the mode can be converted from the waveguide mode to the radiation mode efficiently by mutual cooperation of the optical structures having different periods.

According to another aspect of the invention, there is provided an organic EL light-emitting device of the aforementioned aspect of the invention, characterized in that the two or more optical structures are formed in the same two-dimensional plane.

With the two or more optical structures formed in the same two-dimensional plane, the different periods can be realized at the same time, and therefore the mode can be converted more efficiently from the waveguide mode to the radiation mode.

According to another aspect of the invention, there is provided an organic EL light-emitting device of the fifth aspect of the invention, characterized in that the regularity is such that the period of the effective wavelength degree of the light emitted from the organic EL layer coexists with the fluctuation of not more than one fourth of the period of the effective wavelength degree.

The coexistence of the period and the fluctuation in the regularity makes effective interference with the light having a spread of wavelength emitted from the organic EL layer, thereby improving the light extraction efficiency of the organic EL light-emitting device.

According to another aspect of the invention, there is provided an organic EL light-emitting device of the fifth aspect of the invention, characterized in that the period of the regularity changes gradually.

The gradual change of the period makes it possible to interfere more effectively with the light having a spread of wavelength emitted from the organic EL layer, thereby improving the light extraction efficiency of the organic EL light-emitting device.

According to another aspect of the invention, there is provided an organic EL light-emitting device of the fifth aspect of the invention, characterized in that the regularity of the refractive index distribution in the two-dimensional direction has a tetragonal lattice arrangement, a triangular lattice arrangement, a honeycomb lattice arrangement or such an arrangement that the plane can be filled up with a finite number of unit elements or any combination thereof.

Since the regularity of the refractive index distribution can be realized in the two-dimensional direction, the light extraction efficiency of the organic EL light-emitting device is improved.

According to another aspect of the invention, there is provided an organic EL light-emitting device of the fifth aspect of the invention, characterized in that the regularity of the refractive index distribution is formed of a material having a higher refractive index than a material lacking the regularity of the refractive index distribution.

Due to the fact that the regularity of the refractive index distribution can be formed of a material having a higher refractive index than the surrounding materials, the light extraction efficiency of the organic EL light-emitting device is improved.

According to another aspect of the invention, there is provided an organic EL light-emitting device of the aforementioned aspect of the invention, characterized in that the material having a high refractive index is transparent to the light emitted from the organic EL layer.

The transparency to the light emitted from the organic EL layer can reduce the optical loss of the waveguide mode and improve the light extraction efficiency of the organic EL light-emitting device.

According to another aspect of the invention, there is provided an organic EL light-emitting device of the fifth aspect of the invention, characterized in that the regularity of the refractive index distribution is formed of a material having a lower refractive index than the material lacking the regularity of the refractive index distribution.

Since the regularity of the refractive index distribution can be formed of a material having a lower refractive index than the surrounding materials, the light extraction efficiency of the organic EL light-emitting device can be improved.

According to another aspect of the invention, there is provided an organic EL light-emitting device of the aforementioned aspect of the invention, characterized in that the material having a low refractive index is transparent to the light emitted from the organic EL layer.

The transparency to the light emitted from the organic EL layer can reduce the optical loss of the waveguide mode and improve the light extraction efficiency of the organic EL light-emitting device.

According to another aspect of the invention, there is provided an organic EL light-emitting device of the aforementioned aspect of the invention, characterized in that the material having a low refractive index is a gas.

The gas generally has a refractive index of about 1, and therefore can be used as a material having a low refractive index against the transparent electrode and the transparent substrate. Thus, a regularity of a refractive index distribution can be formed of a material having a low refractive index, thereby improving the light extraction efficiency of the organic EL light-emitting device.

According to another aspect of the invention, there is provided an organic EL light-emitting device of the aforementioned aspect of the invention, characterized in that the gas is the air or an inert gas.

In the case where the transparent electrode or the transparent substrate is fabricated in the air or an inert gas, an organic EL light-emitting device having a high light extraction efficiency can be easily produced by trapping the gas.

According to another aspect of the invention, there is provided an organic EL light-emitting device of the fifth aspect of the invention, characterized in that the mode conversion means arranged in the boundary between the substrate and the exterior of the substrate, the boundary between the substrate and the first electrode, the boundary between the first electrode and the organic EL layer, the boundary between the organic EL layer and the second electrode, the boundary between the second electrode and the exterior of the second electrode, the boundary between the substrate and the waveguide layer, the boundary between the first electrode and the waveguide layer, the boundary between the organic EL layer and the waveguide layer, the boundary between the second electrode and the waveguide layer, the boundary between the waveguide layer and the exterior of the waveguide layer or the boundary between the waveguide layer and the waveguide layer, is formed of an unevenness of the boundary having a regularity in the one-dimensional or two-dimensional direction.

As an alternative, there is provided an organic EL light-emitting device of the fifth aspect of the invention, characterized in that the mode conversion means arranged in the boundary between the transparent substrate and the exterior of the transparent substrate, the boundary between the transparent substrate and the transparent electrode, the boundary between the transparent electrode and the organic EL layer, the boundary between the organic EL layer and the metal electrode, the boundary between the metal electrode and the exterior of the metal electrode, the boundary between the transparent substrate and the waveguide layer, the boundary between the transparent electrode and the waveguide layer, the boundary between the organic EL layer and the waveguide layer, the boundary between the metal electrode and the waveguide layer, the boundary between the waveguide layer and the exterior of the waveguide layer and the boundary between the waveguide layer and the waveguide layer, is formed of an unevenness of the boundary having a regularity in the one-dimensional or two-dimensional direction.

The provision of the unevenness having a regularity in the boundary in the one-dimensional or two-dimensional direction makes it possible to configure the mode conversion means without any material of a different refractive index. Thus, the organic EL light-emitting device having a high light extraction efficiency can be easily fabricated.

According to another aspect of the invention, there is provided an organic EL light-emitting device of the fifth aspect of the invention, characterized in that the organic EL layer has a different emitted light wavelength in a different area.

The light extraction efficiency of the organic EL light-emitting device having a different emitted light wavelength depending on an area can be improved also by the provision of a mode conversion means.

According to another aspect of the invention, there is provided an organic EL light-emitting device of the aforementioned aspect of the invention, characterized in that the conversion means is an optical structure having a regularity of a refractive index distribution in the one-dimensional, two-dimensional or the three-dimensional direction corresponding to the different emitted light wavelength.

The mode conversion means can be provided in accordance with the wavelength of the light emitted from the organic EL layer. The organic EL light-emitting device to emit the R, G, B light in full color, for example, can include an optimum mode conversion means for each emitted light color, thereby improving the light extraction efficiency of the organic EL light-emitting device.

Effects of the Invention

As explained above, according to this invention, the conversion from the waveguide mode to the radiation mode is made possible by use of the mode conversion means, thereby improving the light extraction efficiency of the light-emitting device such as an organic EL light-emitting device.

Figure 1:
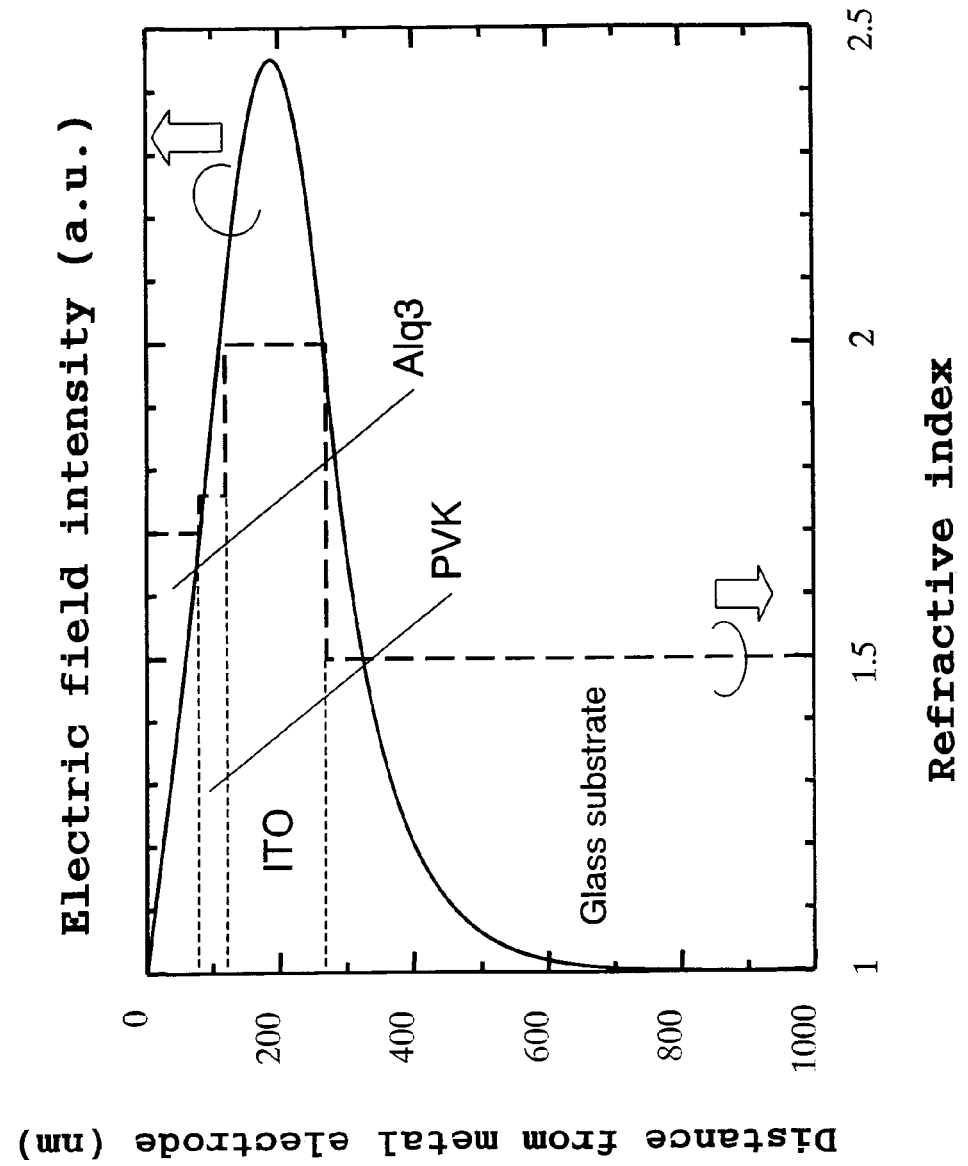
FIG. 1 is a diagram showing the electric field distribution of the transparent electrode waveguide mode trapped in the transparent electrode.
Figure 2:
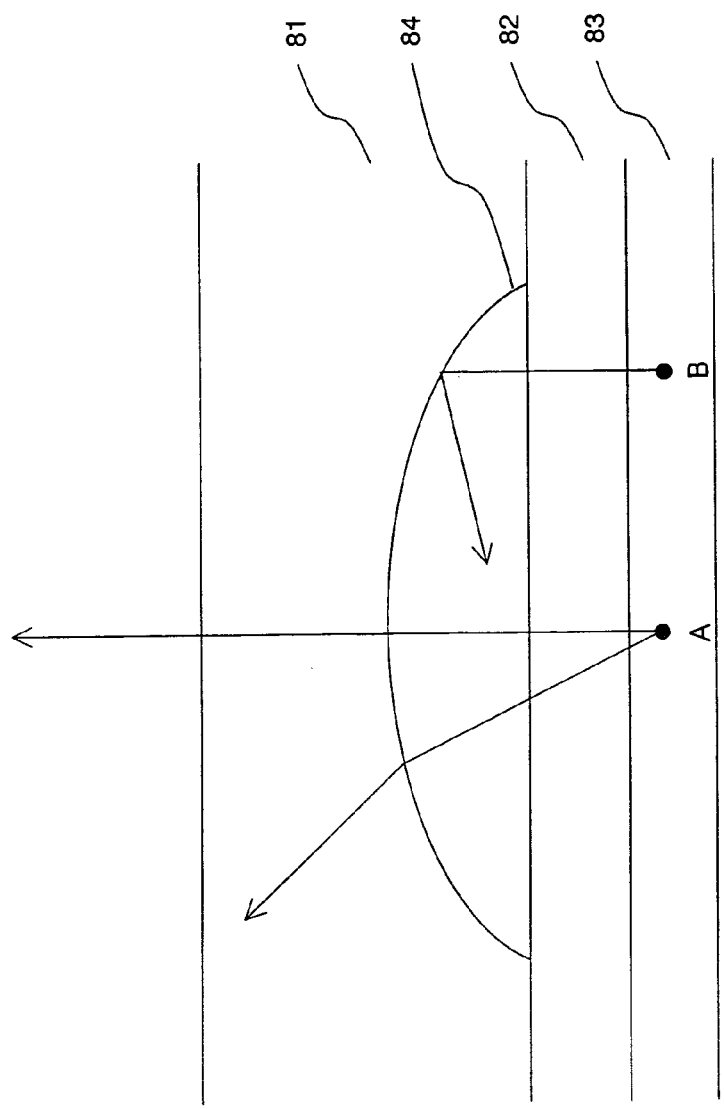
FIG. 2 is a diagram for explaining a technique in which a condensing lens is arranged in the boundary between the transparent electrode and the transparent substrate according to the prior art.
Figure 3:
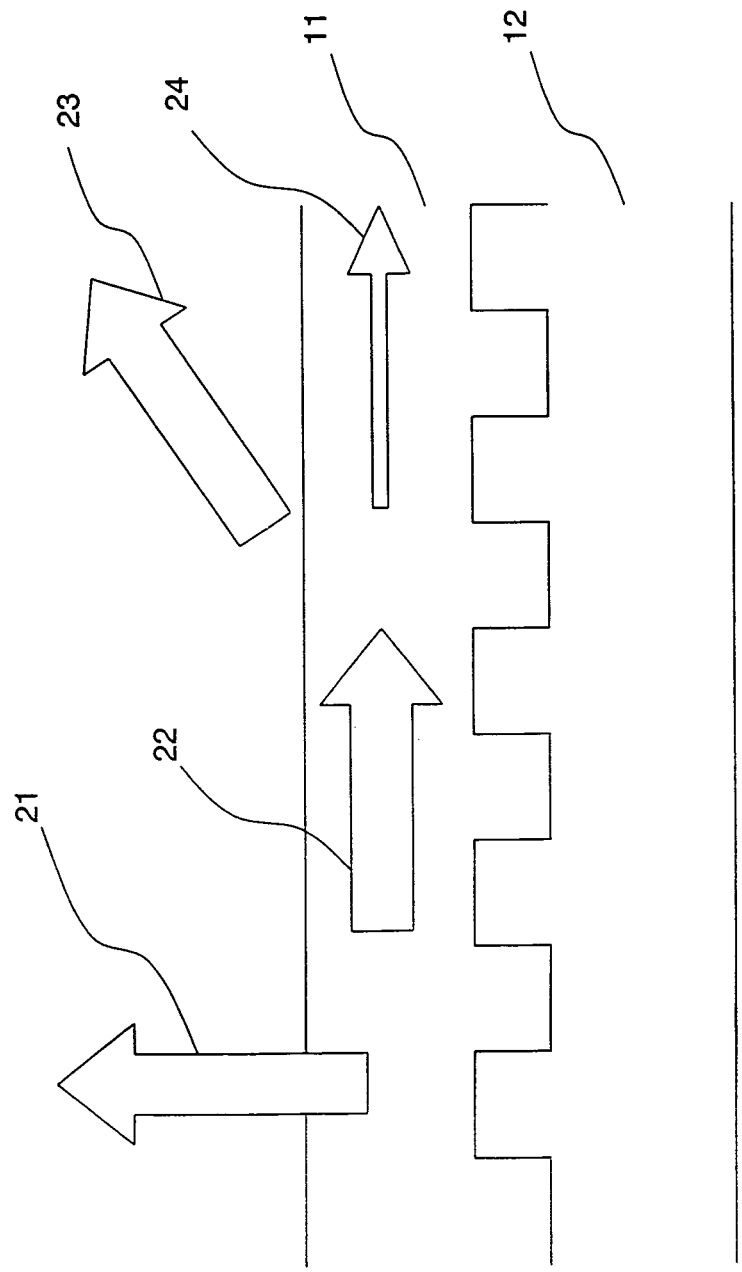
FIG. 3 is a diagram for explaining the basic principle of this invention.

The reference numerals denote the component parts described below.

22 Waveguide mode
23 Radiation mode
25 Optical structure
31 Metal electrode
32 Organic EL layer
33 Transparent electrode
34 Transparent substrate
35 Transparent insulating film
41 Mode conversion means
42 Mode conversion means
44 Substrate
45 First electrode
46 Organic EL layer
47 Second electrode
48 Transparent insulating layer
49 Optical film
51 Mode conversion means
52 Mode conversion means
81 Glass substrate
82 Transparent electrode
83 Organic EL layer
84 Condensing lens

BEST MODE FOR CARRYING OUT THE INVENTION

An embodiment of the invention is explained below with reference to the accompanying drawings.

Figure 4:
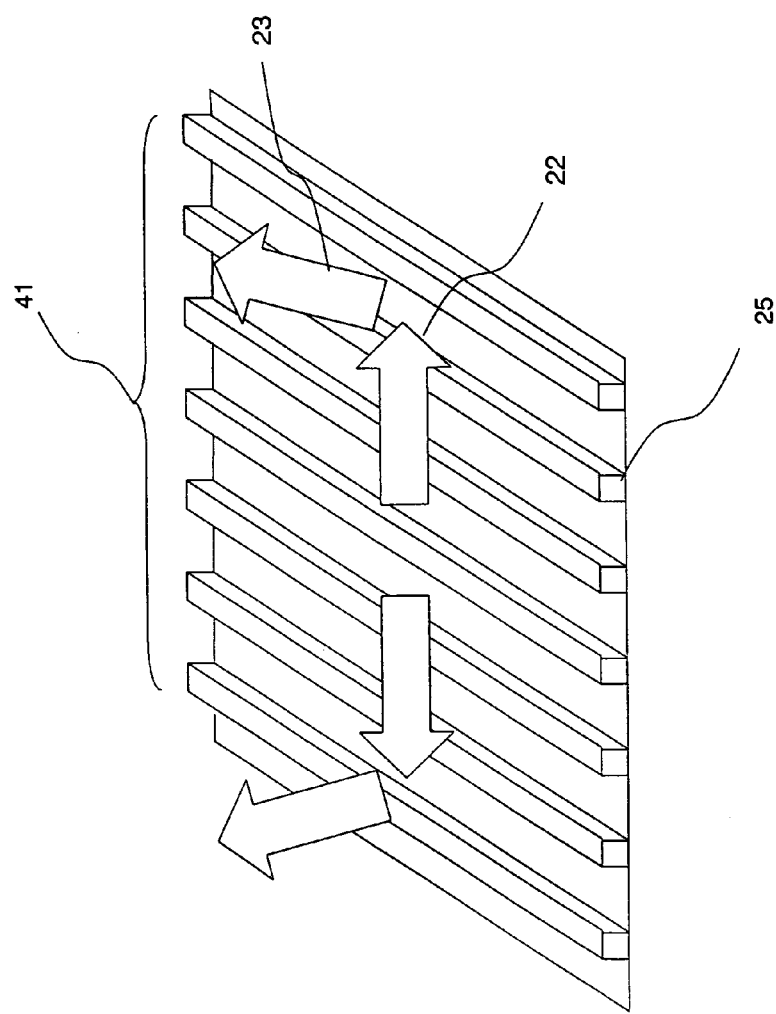
FIG. 4 is a diagram for explaining an example of the optical structure having a regularity of a refractive index distribution in the one-dimensional direction.

As a mode conversion means for converting the waveguide mode to the radiation mode, an example of the optical structure having a regularity of a refractive index distribution on the one-dimensional direction. In FIG. 4, numeral 22 denotes a waveguide mode, 23 a radiation mode, 25 an optical structure and 41 a mode conversion means. In FIG. 4, the optical structure 25 is arranged in the one-dimensional direction (horizontal direction in FIG. 4) as the mode conversion means 41. The refractive index of the optical structure 25 is set different from the refractive index of a material having no optical structure 25.

In the case where the optical structure 25 is arranged with such a period as to suppress the propagation of the light in the waveguide mode 22, the waveguide mode 22 is converted into the radiation mode 23 and radiated outside. The provision of this mode conversion means makes it possible to convert the waveguide mode to the radiation mode in the one-dimensional direction.

Figure 5:
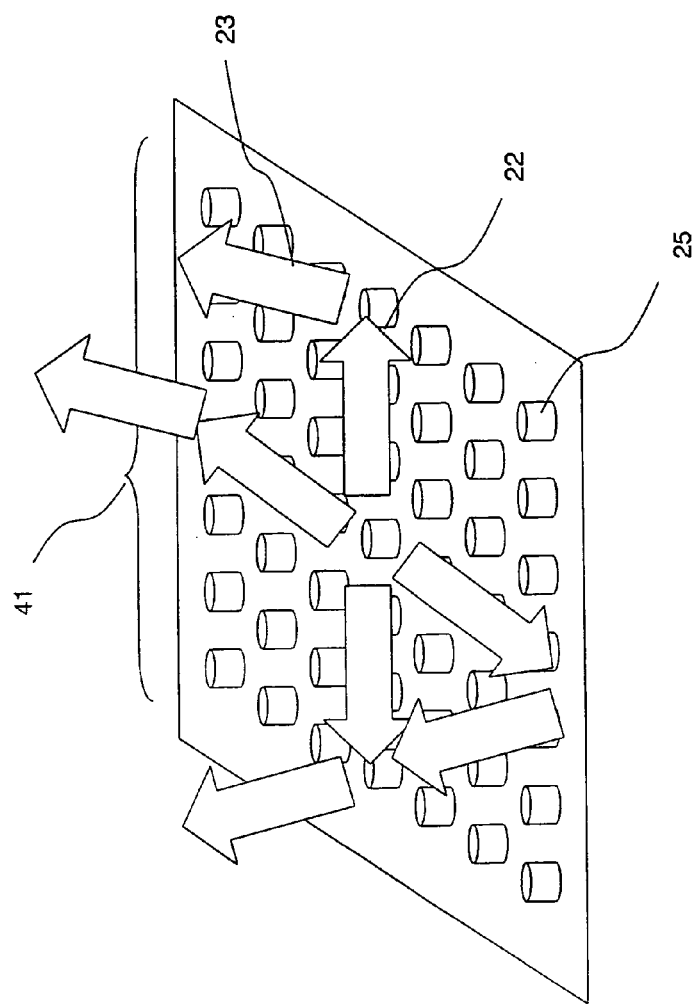
FIG. 5 is a diagram for explaining an example of the optical structure having a regularity of a refractive index distribution in the two-dimensional direction.

As a mode conversion means for converting the waveguide mode to the radiation mode, an example of the optical structure having a regularity of a refractive index distribution in the two-dimensional direction is shown in FIG. 5. In FIG. 5, numeral 22 denotes a waveguide mode, 23 a radiation mode, 25 an optical structure and 41 a mode conversion means. In FIG. 5, the optical structure 25 is arranged in the two-dimensional direction (horizontal and vertical directions in FIG. 5) as the mode conversion means 41. The refractive index of the optical structure 25 is set different from the refractive index of a material in the absence of the optical structure 25.

In the case where the optical structure 25 is arranged in such a period as to suppress the propagation of the light in the waveguide mode 22, the waveguide mode 22 is converted to the radiation mode 23 and radiated outside. The provision of this mode conversion means makes it possible to convert the waveguide mode to the radiation mode in the two-dimensional direction.

Figure 6:
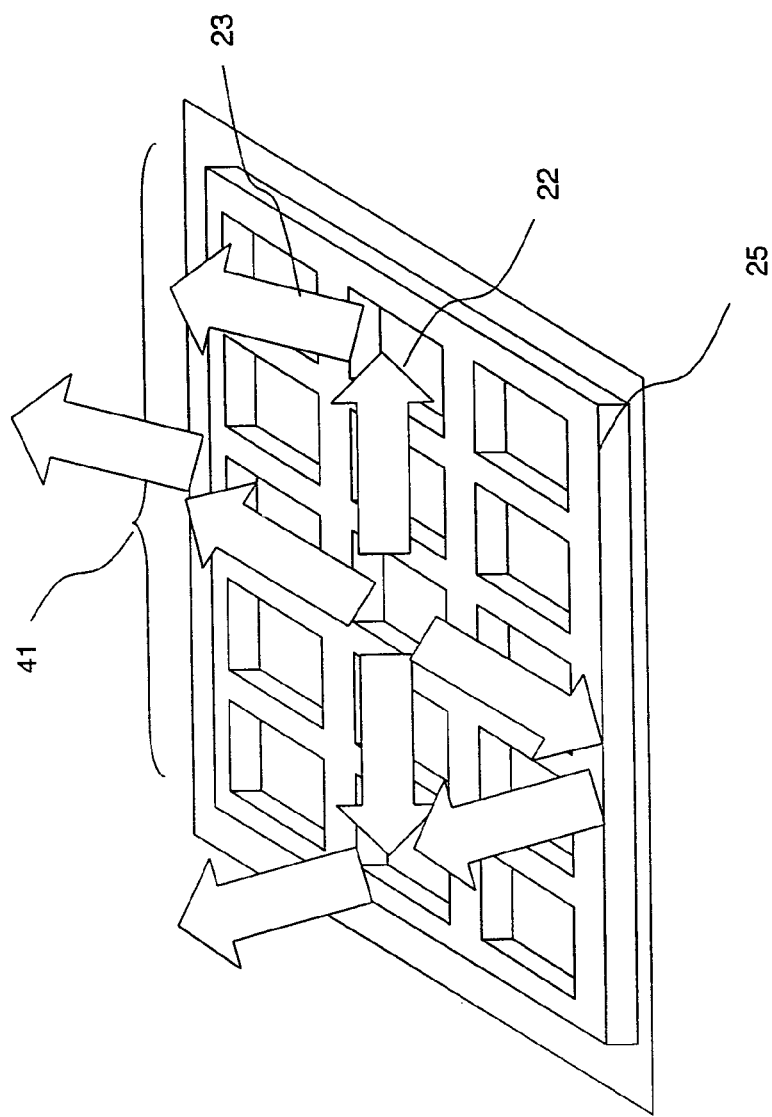
FIG. 6 is a diagram for explaining an example of the optical structure having a regularity of a refractive index distribution in the two-dimensional direction of a matrix arrangement.

In FIG. 5, the optical structure 25 is arranged at an intersection in a two-dimensional matrix, and a similar effect is obtained by arranging the optical structure explained in FIG. 4 in a two-dimensional matrix, as shown in FIG. 6. Further, an optical structure having a regularity of a refractive index distribution in the three dimensional direction may be arranged. In this case, the optical structure may be arranged at an intersection in a three-dimensional matrix or the optical structure may be arranged in a three-dimensional matrix. The arrangement of the optical structure in the three-dimensional direction makes possible a more complicated design. For example, the mode conversion function can be exhibited over a wider wavelength range.

Figure 7:
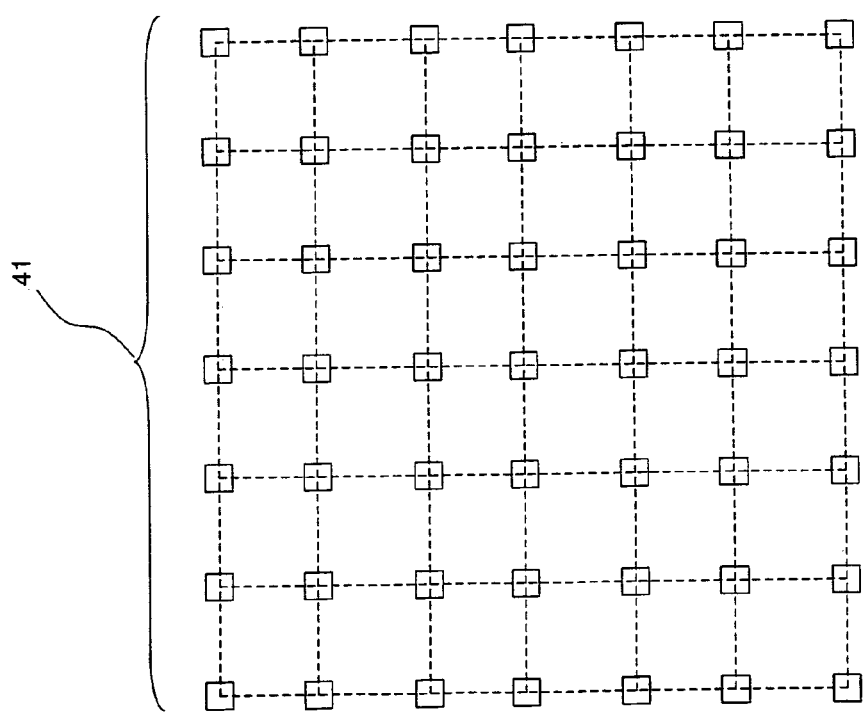
FIG. 7 is a diagram for explaining an example of the optical structure arranged in a tetragonal lattice as a mode conversion means.

Next, an example of the refractive index distribution having a regularity in the two-dimensional direction is explained. FIG. 7 shows an example in which an optical structure is arranged in a tetragonal lattice as a mode conversion means. The optical structure may be arranged at each intersection of dotted lines or along the dotted lines in FIG. 7. Once the period in each direction comes to coincide, the same wavelength characteristic is obtained in each direction. A different period for each direction leads to a different wavelength characteristic in each direction.

Figure 8:
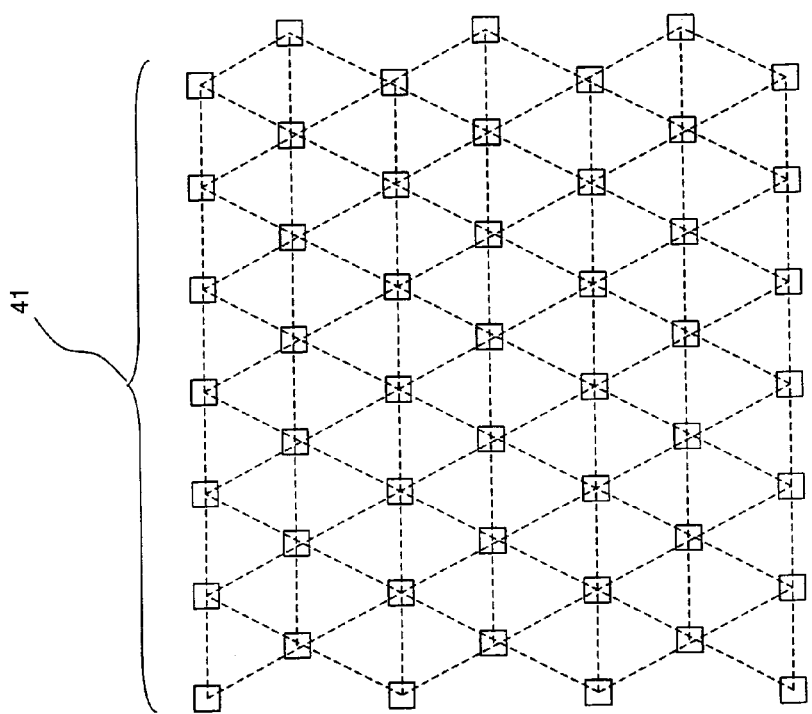
FIG. 8 is a diagram for explaining an example of the optical structure arranged in a triangular lattice as a mode conversion means.

FIG. 8 shows an example in which the optical structure is arranged in a triangular lattice as a mode conversion means. The optical structure may be arranged at each intersection of dotted lines or along the dotted lines in FIG. 8. Once the period in each direction comes to coincide, the same wavelength characteristic is obtained in each direction. A different period for each direction leads to a different wavelength characteristic in each direction.

Figure 9:
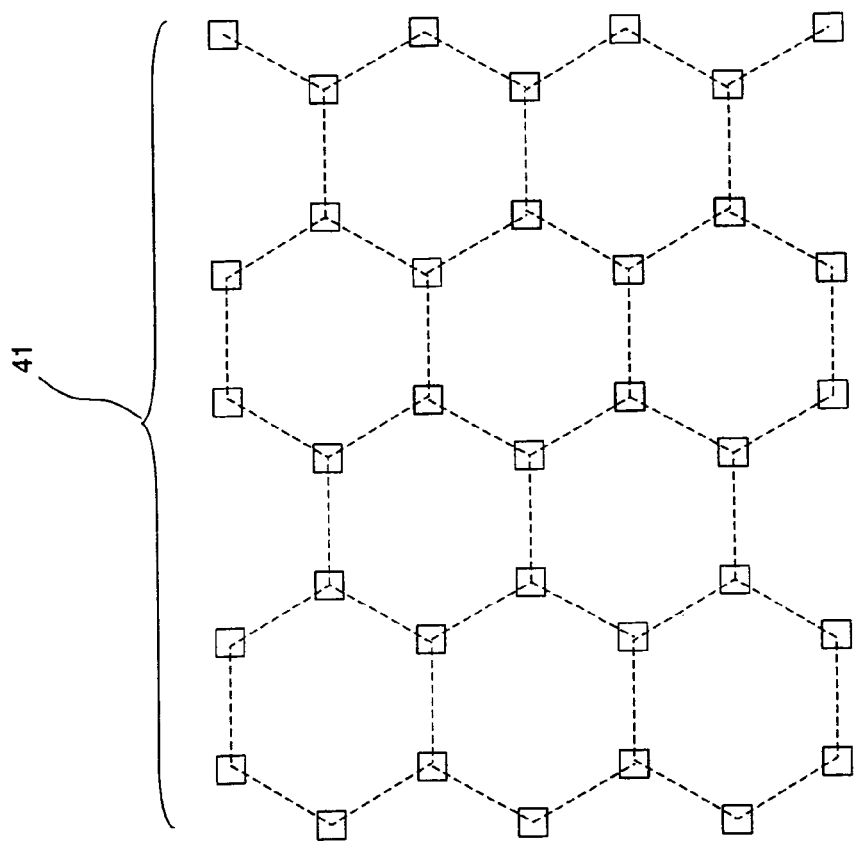
FIG. 9 is a diagram for explaining an example of the optical structure arranged in a honeycomb lattice as a mode conversion means.

FIG. 9 shows an example in which the optical structure is arranged in a honeycomb lattice as a mode conversion means. The optical structure may be arranged at each intersection of dotted lines or along the dotted lines in FIG. 9. Once the period in each direction comes to coincide, the same wavelength characteristic is obtained in each direction. A different period for each direction leads to a different wavelength characteristic in each direction.

Figure 10:
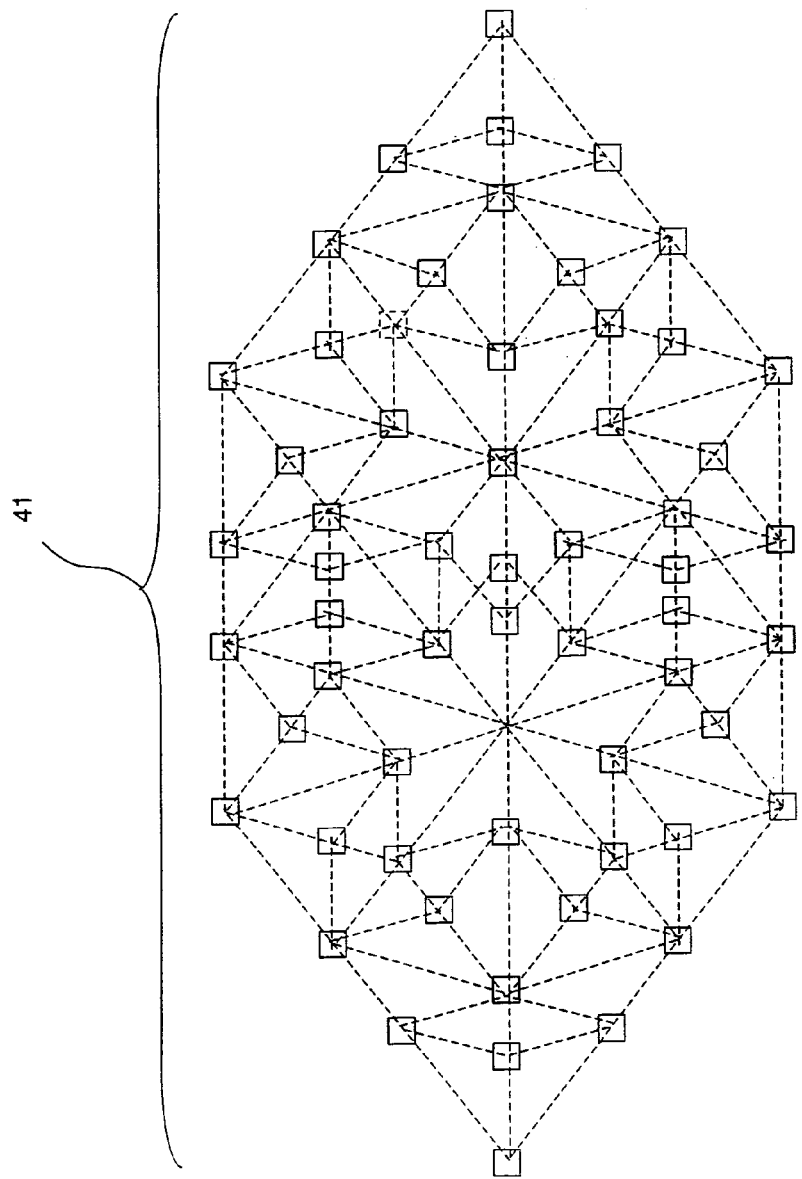
FIG. 10 is a diagram for explaining an example of an arrangement in which a plane can be filled up with a finite number of unit elements as a mode conversion means.

FIG. 10 shows an example in which a mode conversion means is arranged in such a manner as to fill up a plane with a finite number of unit elements. FIG. 10 shows a type of Penrose tile prepared in a combination of similar triangles of two types which can fill up the plane. This arrangement makes it possible to design the wavelength characteristics in a greater number of directions.

The mode conversion means having the structure described with reference to FIGS. 4 to 10 are illustrative and the invention is not limited to these mode conversion means.

In the case where the optical structure has a regularity of a refractive index distribution in the one-dimensional, two-dimensional or the three-dimensional direction, the light extraction efficiency of the organic EL light-emitting device is improved by providing a fluctuation to the regularity of the period of the effective wavelength degree of the light emitted from the organic EL layer. The light emitted from the organic EL layer, which may have a spread of wavelength, can be effectively interfered with. Also, the light from the organic EL light-emitting device can be emitted at a wide angle as well as in a specified direction alone thereby to relax the directivity. The fluctuation is desirably not more than one fourth of the period of the wavelength of the light emitted from the organic EL layer. An excessively large fluctuation would reduce the interference effect.

The fluctuation described above may coexist with the period of the effective wavelength degree of the light emitted from the organic EL layer. The coexistence of a fluctuation with the periodic regularity makes it possible to effectively interfere with the light having a wavelength spread emitted from the organic EL layer for an improved light extraction efficiency of the light emitted from the organic EL light-emitting device. Also, the directivity of the light emitted from the organic EL light-emitting device can be relaxed.

The period of the regularity may be gradually changed in what is called the chirping period. With the gradual change in the period, the light having a spread of wavelength emitted from the organic EL layer can be more effectively interfered with for an improved light extraction efficiency of the organic EL light-emitting device.

Next, an example of the organic EL light-emitting device having an optical structure with a regularity of a refractive index distribution as a mode conversion means is explained. In the description with reference to FIG. 11 and subsequent drawings, the transparent electrode, the organic EL layer, the metal layer and, as required, the transparent insulating film are formed, in that order from the substrate side, on the upper surface of the transparent substrate. In the case of the organic EL light-emitting device of what is called the top emission type in which the light emitted from the organic EL layer is extracted from the side far from the substrate, an opaque substrate like a Si substrate may be used in place of the transparent substrate. In the case where a Si substrate is used, the surface on the side making up the electrode is desirably oxidized into $SiO_2$ to insulate from the electrode on the substrate. The oxidization uses a method of thermally oxidizing in which the surface of the Si substrate is oxided by bringing the oxygen atmosphere or water vapor into contact with the Si substrate heated to high temperature. In the organic EL light-emitting device of top emission type, the light is not emitted from the transparent substrate, and therefore the light extraction efficiency of the light emitted from the organic EL layer is high. Also, the use of Si or $SiO_2$ for the substrate increases the heat radiation effect. Further, an electronic circuit, if mounted on the substrate, has no effect on the extraction of the light emitted from the organic EL layer.

In the case of the organic EL light-emitting device of top emission type, the light emitted from the organic EL layer is emitted from the side far from the substrate, and therefore the transparent electrode formed on the upper surface of the substrate may be replaced with a metal electrode as a first electrode. The material of the metal electrode is desirably a metal adapted for carrier transportation and injection into the organic EL layer.

Also, in the case of the organic EL light-emitting device of top emission type, the metal electrode formed on the upper surface of the organic EL layer may be replaced by a second electrode opposed to the first electrode. In the organic EL light-emitting device of top emission type, the light from the organic EL layer is emitted from the second electrode side, and therefore the second electrode is desirably transparent to the light emitted from the organic EL layer. The translucent electrode usable in this case includes such an oxide as ITO (indium tin oxide), IZO (indium zinc oxide), $SnO_2$ (tin oxide), In$_2$O$_3$ (indium oxide) or ZnO (zinc oxide). The second electrode may be a thin metal electrode formed of a thin film metal such as Au or Ni. Also, the second electrode may be a thin metal electrode arranged on the side of the translucent electrode nearer to the organic EL layer.

Figure 11:
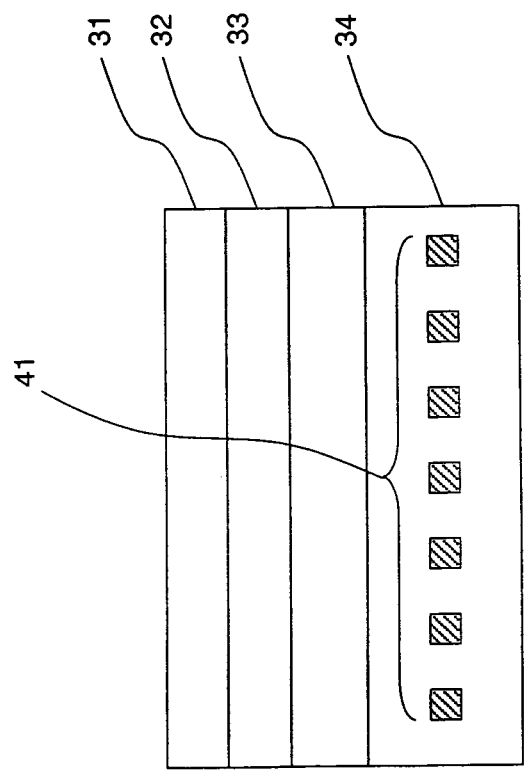
FIG. 11 is a diagram for explaining an example of the organic EL light-emitting device with the mode conversion means built in the transparent substrate.
Figure 12:
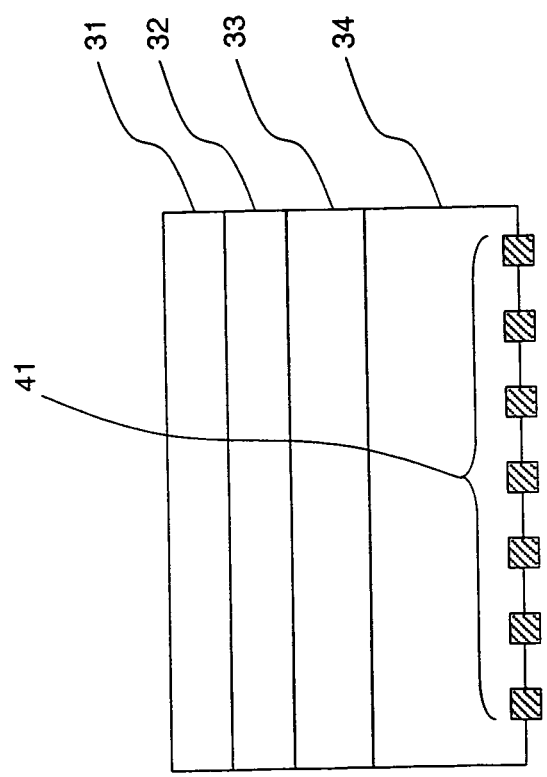
FIG. 12 is a diagram for explaining an example of the organic EL light-emitting device with the mode conversion means built in the boundary between the transparent substrate and the exterior of the transparent substrate.
Figure 13:
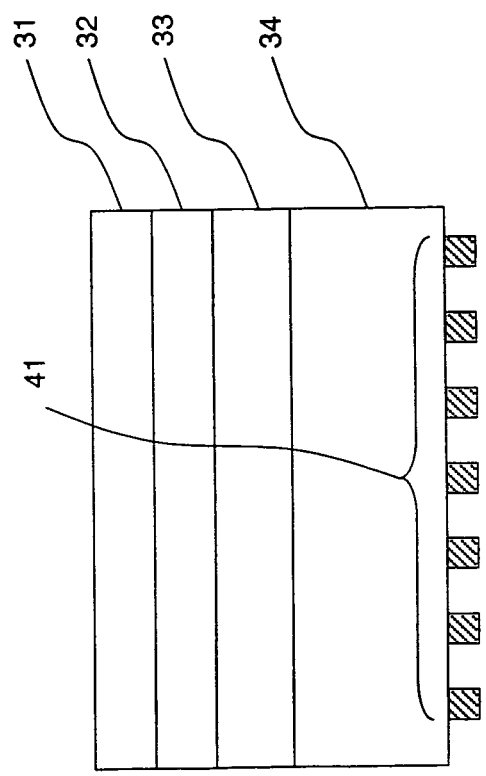
FIG. 13 is a diagram for explaining an example of the organic EL light-emitting device with the mode conversion means built in the boundary between the transparent substrate and the exterior of the transparent substrate.
Figure 14:
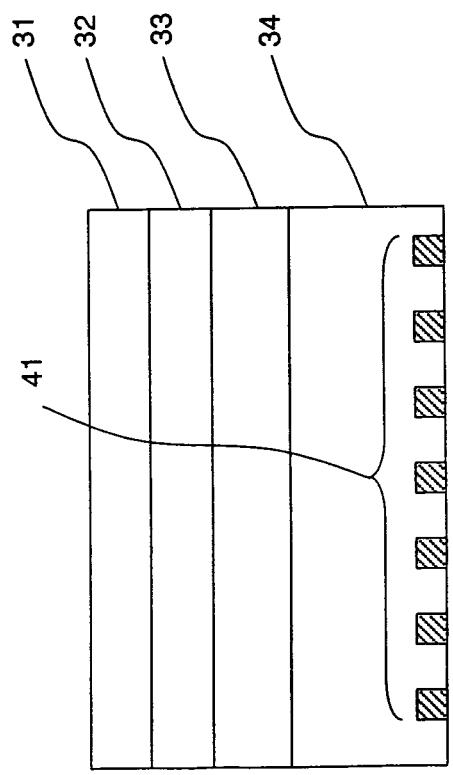
FIG. 14 is a diagram for explaining an example of the organic EL light-emitting device with the mode conversion means built in the boundary between the transparent substrate and the exterior of the transparent substrate.

FIG. 11 shows an example of the organic EL light-emitting device having a mode conversion means in the transparent substrate. FIGS. 12 to 14 show an example of the organic EL light-emitting device having a mode conversion means in the boundary between the transparent substrate and the exterior of the transparent substrate. In FIGS. 11 to 14, numeral 31 denotes a metal electrode, 32 an organic EL layer, 33 a transparent electrode, 34 a transparent substrate, and 41 mode conversion means. The transparent substrate includes a glass substrate, a flexible substrate, or a substrate in which a color filter, a color conversion film or a dielectric reflection film is formed. The transparent substrate can be formed of glass, polyethylene terephthalate, polycarbonate or amorphous polyolefin.

The mode conversion means 41 shown in FIG. 11 may have a refractive index distribution having a regularity in the one-dimensional direction, two-dimensional or the three-dimensional direction. The mode conversion means 41 shown in FIGS. 12 to 14 may have a refractive index distribution having a regularity in the one-dimensional or two-dimensional direction. The provision of the mode conversion means in the transparent substrate or the boundary between the transparent substrate and the exterior of the transparent substrate makes it possible to convert the transparent substrate waveguide mode to the radiation mode, so that the light emitted from the organic EL layer can be efficiently extracted externally.

The mode conversion means 41 shown in FIG. 11 is formed by two separate growth sessions of the transparent substrate 34 or by coupling two transparent substrates. The mode conversion means 41 shown in FIGS. 12 to 14, on the other hand, can be formed by etching one surface of the transparent substrate 34. By forming the transparent electrode 33, the organic EL layer 32 and the metal electrode 31 on the upper surface of transparent substrate, the organic EL light-emitting device can be fabricated. The organic EL light-emitting device according to the invention is not limited to the fabrication method described herein.

Figure 15:
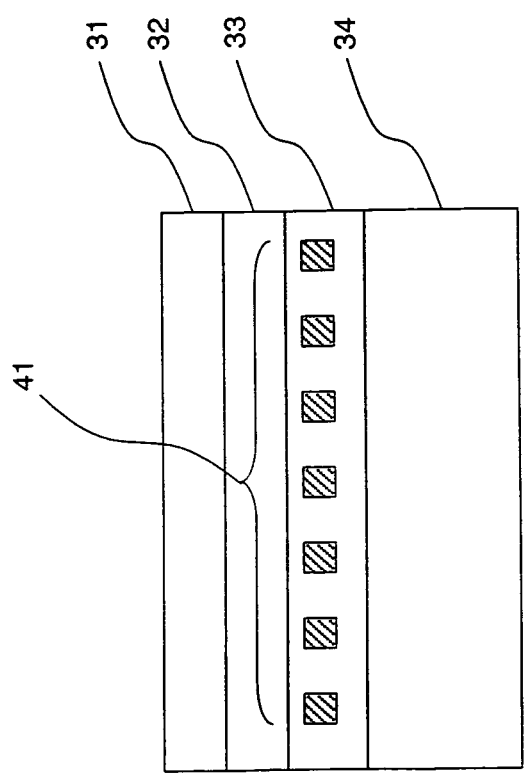
FIG. 15 is a diagram for explaining an example of the organic EL light-emitting device with the mode conversion means built in the transparent electrode.
Figure 16:
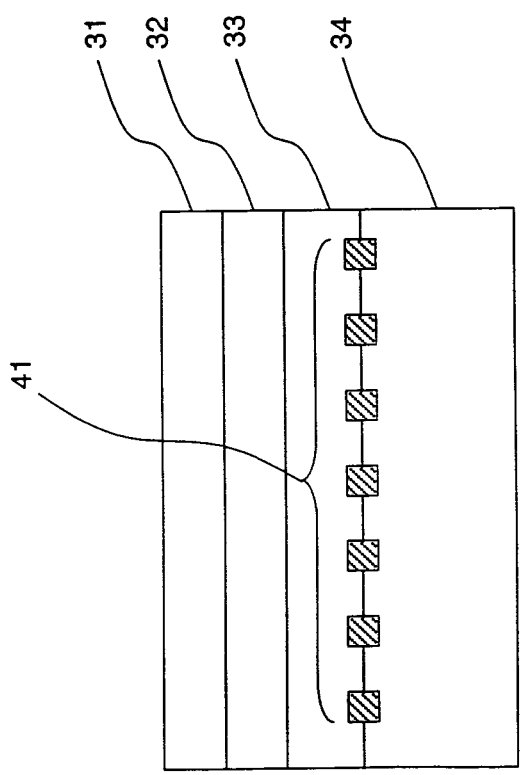
FIG. 16 is a diagram for explaining an example of the organic EL light-emitting device with the mode conversion means built in the boundary between the transparent electrode and the transparent substrate.
Figure 17:
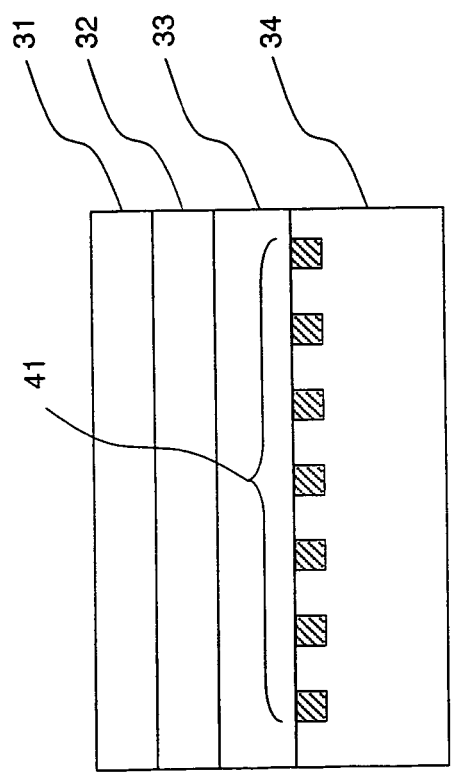
FIG. 17 is a diagram for explaining an example of the organic EL light-emitting device with the mode conversion means built in the boundary between the transparent electrode and the transparent substrate.
Figure 18:
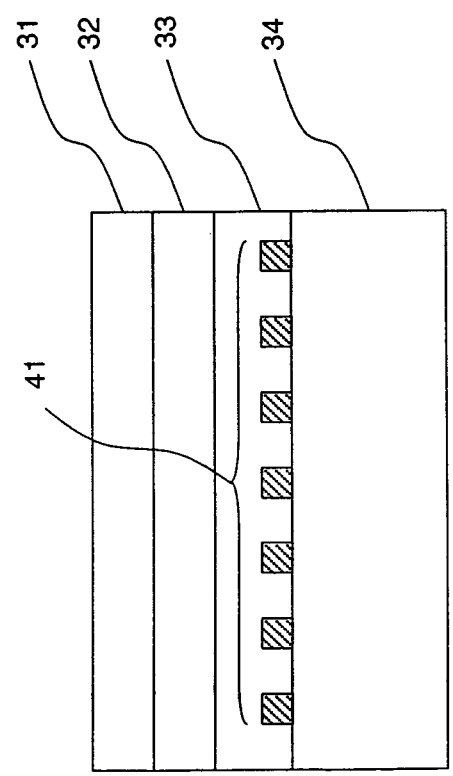
FIG. 18 is a diagram for explaining an example of the organic EL light-emitting device with the mode conversion means built in the boundary between the transparent electrode and the transparent substrate.

FIG. 15 shows an example of the organic EL light-emitting device having the mode conversion means in the transparent electrode. FIGS. 16 to 18 show an example of the organic EL light-emitting device having the mode conversion means in the boundary between the transparent electrode and the transparent substrate. In FIGS. 15 to 18, numeral 31 denotes a metal electrode, 32 an organic EL layer, 33 a transparent electrode, 34 a transparent substrate and 41 mode conversion means. The transparent electrode used as an anode is suitably formed of a metal high in work function in which holes can be easily injected. A material of which the transparency can be easily obtained includes an oxide such as ITO (indium tin oxide), IZO (indium zinc oxide), SnO$_2$ (tin oxide), In$_2$O$_3$ (indium oxide) or ZnO (zinc oxide) or a metal such as Au or Ni.

The mode conversion means 41 shown in FIG. 15 may have a regularity of a refractive index distribution in the one-dimensional, two-dimensional or the three-dimensional direction. The mode conversion means 41 shown in FIGS. 16 to 18 may have a regularity of a refractive index distribution in the one-dimensional or two-dimensional direction. The provision of the mode conversion means in the transparent electrode or the boundary between the transparent electrode and the transparent substrate makes it possible to convert the transparent substrate waveguide mode or the transparent electrode waveguide mode to the radiation mode, so that the light emitted from the organic EL layer can be efficiently extracted out of the transparent substrate.

The mode conversion means 41 shown in FIG. 15 can be fabricated by two growth separate sessions while forming the transparent substrate 33 by vapor deposition or sputtering. The mode conversion means 41 shown in FIGS. 16 to 18, on the other hand, can be formed by etching one surface of the transparent substrate 34, then the transparent electrode 33, the organic EL layer 32 and the metal electrode 31 are formed on the upper surface of the transparent substrate thereby to fabricate the organic EL light-emitting device. The organic EL light-emitting device according to the invention is not limited to the fabrication method described herein.

Figure 19:
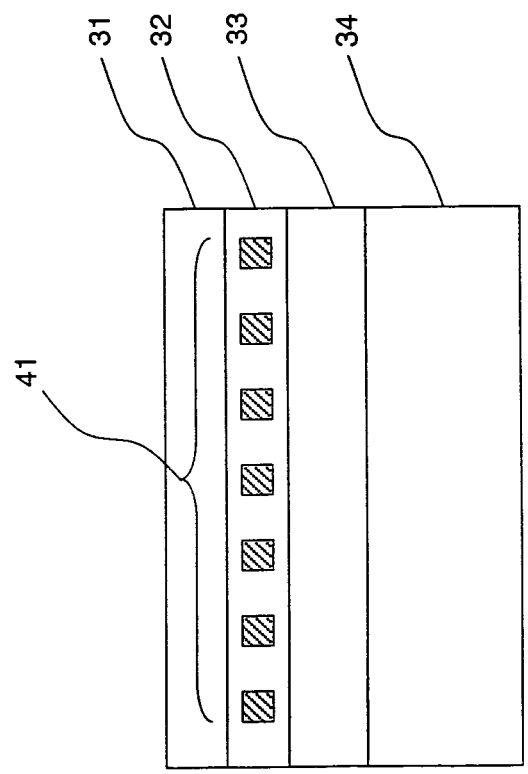
FIG. 19 is a diagram for explaining an example of the organic EL light-emitting device with the mode conversion means built in the organic EL layer.
Figure 20:
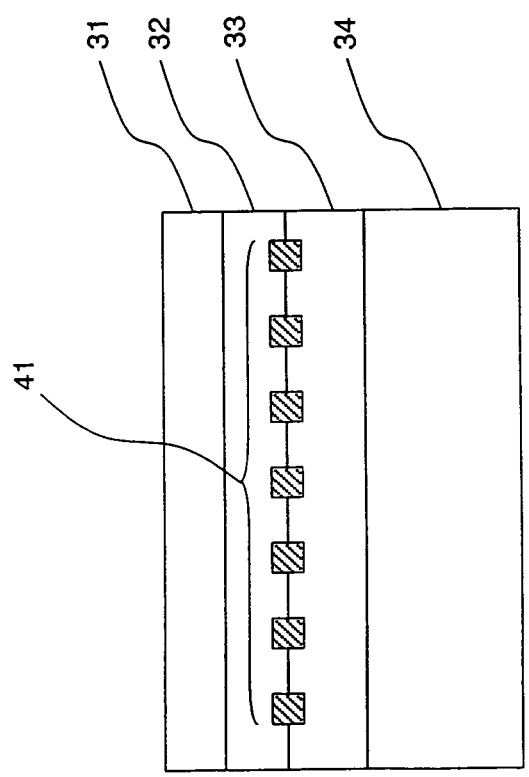
FIG. 20 is a diagram for explaining an example of the organic EL light-emitting device with the mode conversion means built in the boundary between the organic EL layer and the transparent electrode.
Figure 21:
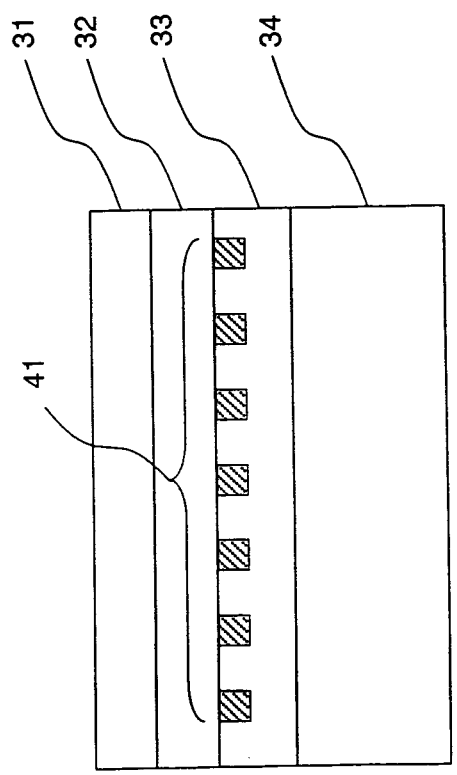
FIG. 21 is a diagram for explaining an example of the organic EL light-emitting device with the mode conversion means built in the boundary between the organic EL layer and the transparent electrode.
Figure 22:
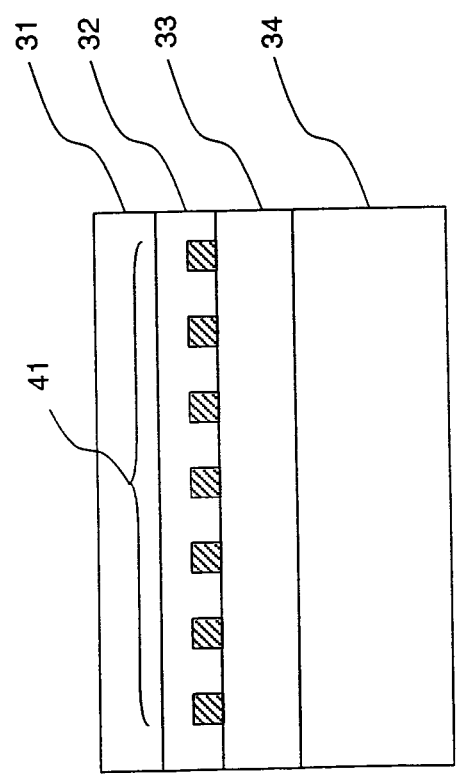
FIG. 22 is a diagram for explaining an example of the organic EL light-emitting device with the mode conversion means built in the boundary between the organic EL layer and the transparent electrode.

FIG. 19 shows an example of the organic EL light-emitting device having the mode conversion means in the organic EL layer. FIGS. 20 to 22 show an example of the organic EL light-emitting device having the mode conversion means in the boundary between the organic EL layer and the transparent electrode. In FIGS. 19 to 22, numeral 31 denotes a metal electrode, 32 an organic EL layer, 33 a transparent electrode, 34 a transparent substrate and 41 mode conversion means.

The mode conversion means 41 shown in FIG. 19 may have a regularity of a refractive index distribution in the one-dimensional, two-dimensional or the three-dimensional direction. The mode conversion means 41 shown in FIGS. 20 to 22 have a regularity of a refractive index distribution in the one-dimensional or two-dimensional direction. The provision of the mode conversion means in the organic EL layer or the boundary between the organic EL layer and the transparent electrode makes it possible to convert the transparent electrode waveguide mode or the transparent substrate waveguide mode to the radiation mode so that the light emitted from the organic EL layer can be efficiently extracted out of the transparent substrate.

The mode conversion means 41 shown in FIG. 19 can be fabricated by two separate growth sessions while forming the organic EL layer 32 by the spin coat method, vacuum vapor deposition, coating or the ink jet method. The mode conversion means 41 shown in FIGS. 20 to 22, on the other hand, can be formed by etching the surface of the transparent electrode 33, then the organic EL layer 32 and the metal electrode 31 are formed on the upper surface of the transparent electrode thereby to fabricate the organic EL light-emitting device. The organic EL light-emitting device according to the invention is not limited to the fabrication method described herein.

Figure 23:
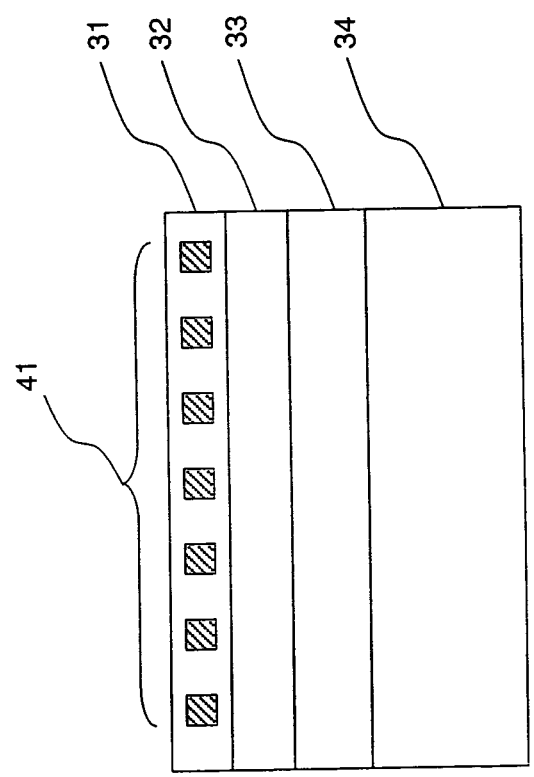
FIG. 23 is a diagram for explaining an example of the organic EL light-emitting device with the mode conversion means built in the metal electrode.
Figure 24:
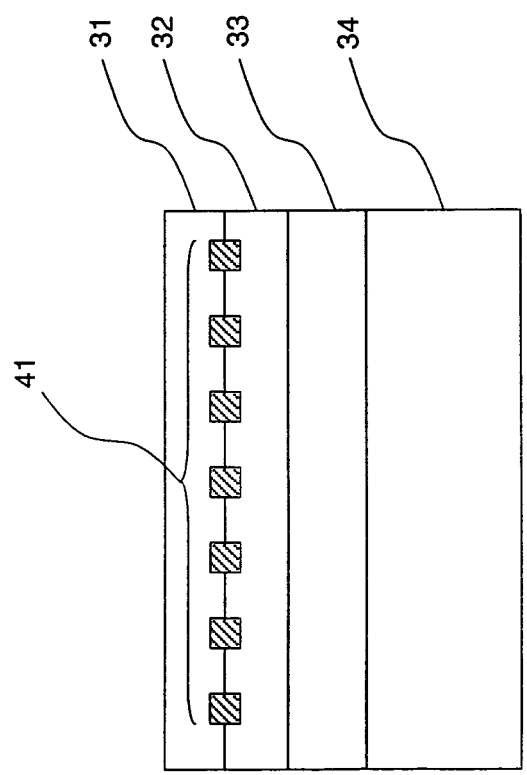
FIG. 24 is a diagram for explaining an example of the organic EL light-emitting device with the mode conversion means built in the boundary between the metal electrode and the organic EL layer.
Figure 25:
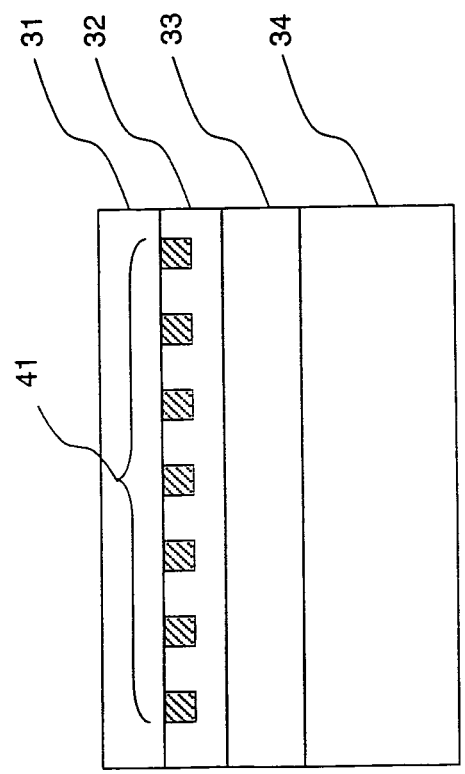
FIG. 25 is a diagram for explaining an example of the organic EL light-emitting device with the mode conversion means built in the boundary between the metal electrode and the organic EL layer.
Figure 26:
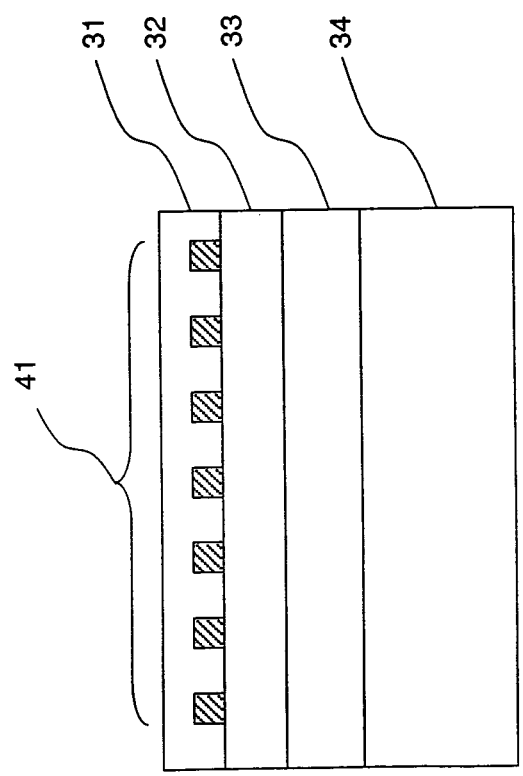
FIG. 26 is a diagram for explaining an example of the organic EL light-emitting device with the mode conversion means built in the boundary between the metal electrode and the organic EL layer.
Figure 27:
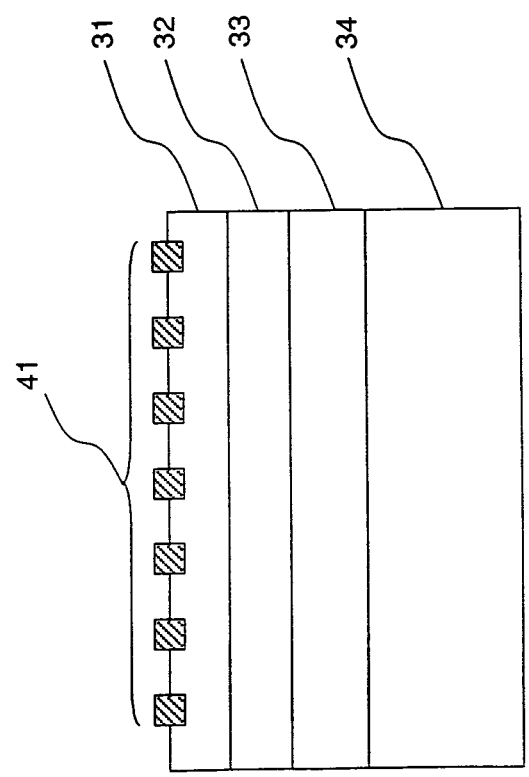
FIG. 27 is a diagram for explaining an example of the organic EL light-emitting device with the mode conversion means built in the boundary between the metal electrode and the exterior of the metal electrode.
Figure 28:
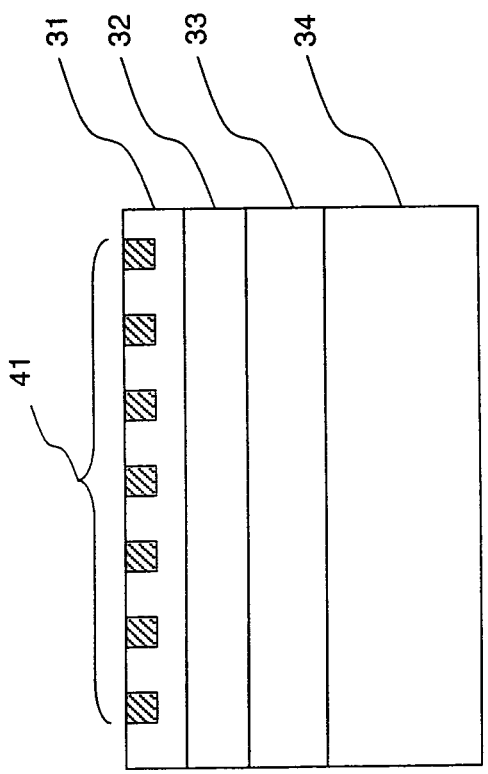
FIG. 28 is a diagram for explaining an example of the organic EL light-emitting device with the mode conversion means built in the boundary between the metal electrode and the exterior of the metal electrode.
Figure 29:
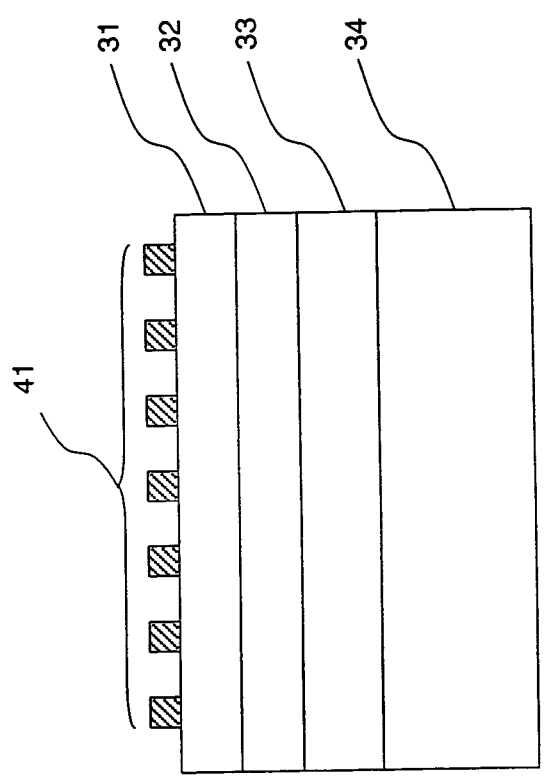
FIG. 29 is a diagram for explaining an example of the organic EL light-emitting device with the mode conversion means built in the boundary between the metal electrode and the exterior of the metal electrode.
Figure 30:
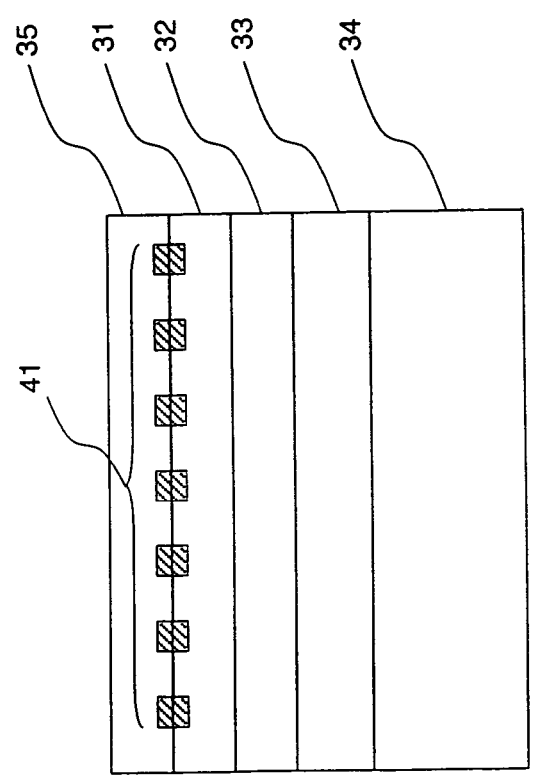
FIG. 30 is a diagram for explaining an example of the organic EL light-emitting device with the mode conversion means built in the boundary between the metal electrode and the transparent insulating film.
Figure 31:
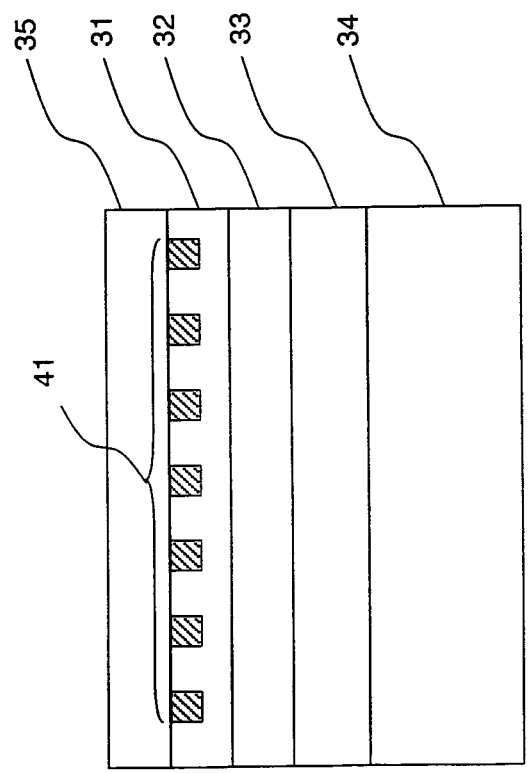
FIG. 31 is a diagram for explaining an example of the organic EL light-emitting device with the mode conversion means built in the boundary between the metal electrode and the transparent insulating film.
Figure 32:
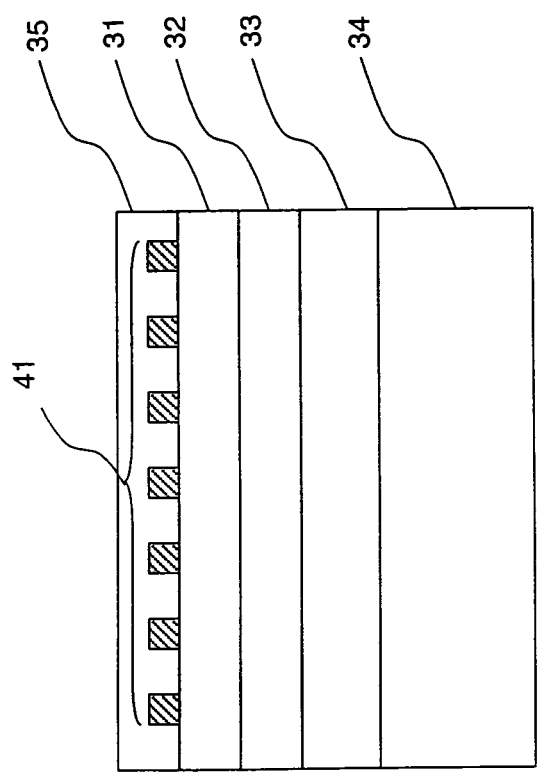
FIG. 32 is a diagram for explaining an example of the organic EL light-emitting device with the mode conversion means built in the boundary between the metal electrode and the transparent insulating film.
Figure 33:
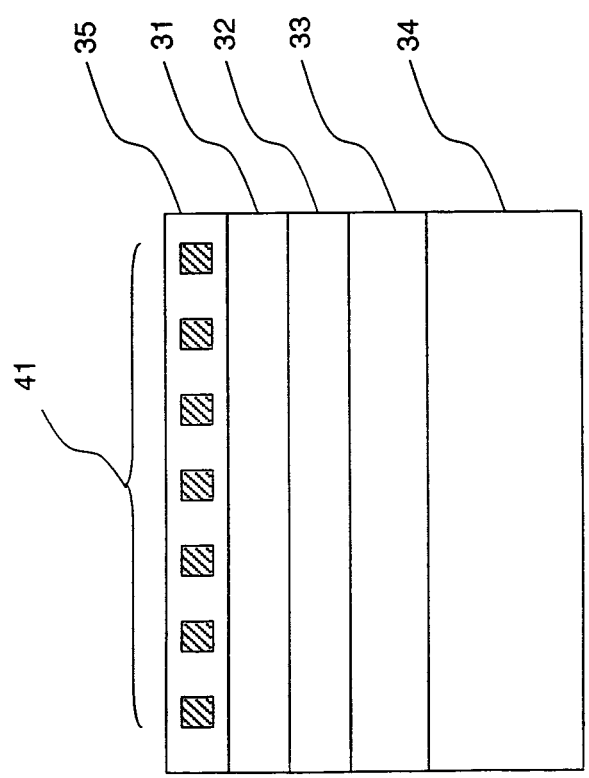
FIG. 33 is a diagram for explaining an example of the organic EL light-emitting device with the mode conversion means built in the transparent insulating film.
Figure 34:
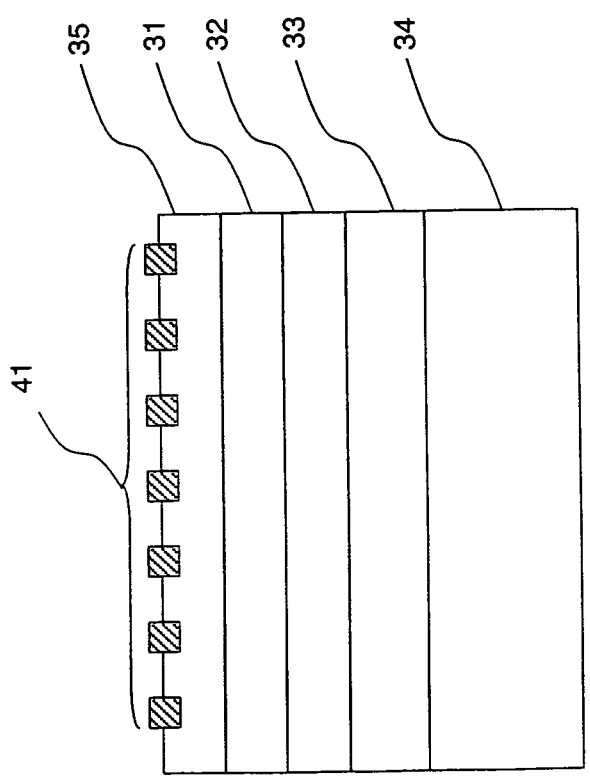
FIG. 34 is a diagram for explaining an example of the organic EL light-emitting device with the mode conversion means built in the boundary between the transparent insulating film and the exterior of the transparent insulating film.
Figure 35:
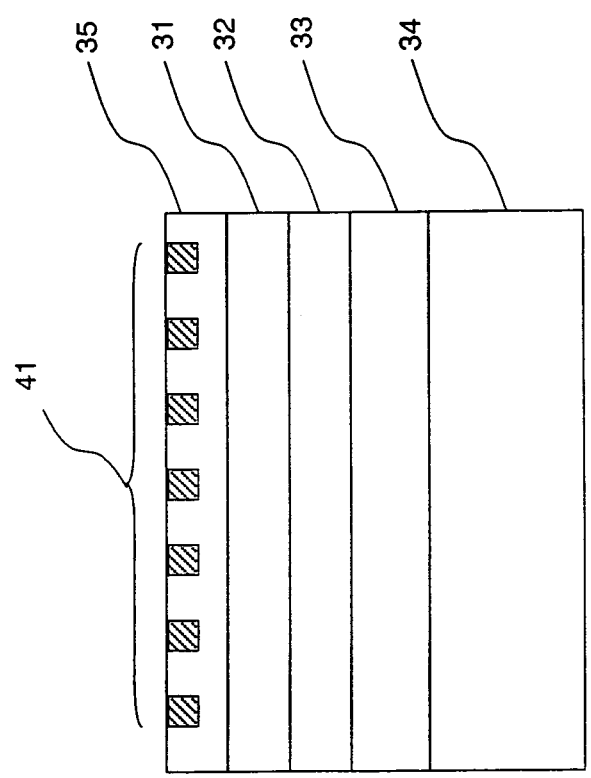
FIG. 35 is a diagram for explaining an example of the organic EL light-emitting device with the mode conversion means built in the boundary between the transparent insulating film and the exterior of the transparent insulating film.
Figure 36:
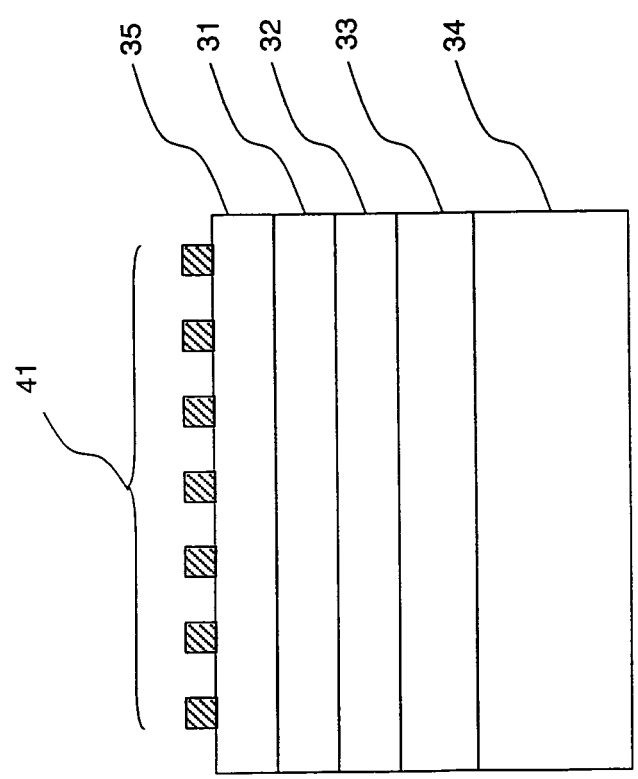
FIG. 36 is a diagram for explaining an example of the organic EL light-emitting device with the mode conversion means built in the boundary between the transparent insulating film and the exterior of the transparent insulating film.

FIG. 23 shows an example of the organic EL light-emitting device having the mode conversion means in the metal electrode. FIGS. 24 to 26 show an example of the organic EL light-emitting device having the mode conversion means in the boundary between the metal electrode and the organic EL layer. FIGS. 27 to 29 show an example of the organic EL light-emitting device having the mode conversion means in the boundary between the metal electrode and the exterior of the metal electrode. In FIGS. 23 to 29, numeral 31 denotes a metal electrode, 32 an organic EL layer, 33 a transparent electrode, 34 a transparent substrate and 41 mode conversion means. A metal low in work function in which electrons can be easily injected is suitable for the metal electrode used as a cathode. The cathode can be formed of such a material as Al, Li, Mg, Au, Ag or an alloy thereof.

The mode conversion means 41 shown in FIG. 23 may have a regularity of a refractive index distribution in the one-dimensional, two-dimensional or the three-dimensional direction. The mode conversion means 41 shown in FIGS. 24 to 29 may have a regularity of a refractive index distribution in the one-dimensional or two-dimensional direction. The provision of the mode conversion means in the boundary between the organic EL layer and the metal electrode as shown in FIGS. 24 or 25, makes it possible to convert the transparent electrode waveguide mode or the transparent substrate waveguide mode to the radiation mode so that the light emitted from the organic EL layer can be efficiently extracted out of the transparent substrate.

In the case where the metal electrode 31 is laminated in the same thickness as or a smaller thickness than the area where the evanescent wave exists, the provision of the mode conversion means in the metal electrode, the boundary between the metal electrode and the organic EL layer and the boundary between the metal electrode and the exterior of the metal electrode as shown in FIGS. 23 to 29 makes it possible to convert the transparent electrode waveguide mode or the transparent substrate waveguide mode to the radiation mode so that the light emitted from the organic EL layer can be efficiently extracted out of the transparent electrode.

Also, by forming the metal electrode 31 of a thin layer, the light emitted from the organic EL layer can be extracted also from the metal electrode 31 side. Further, in the case where the metal electrode 31 is formed in a laminated structure including a translucent metal oxide such as ITO and, on the side of the metal oxide nearer to the organic EL layer, a metal thin film such as Al or Li with a low work function into which electrons can be easily injected, the light can be extracted from the metal electrode 31. Also, in the case where the metal electrode 31 constitutes the anode, the light can be extracted from the metal electrode by use of a translucent metal oxide such as ITO. By providing the mode conversion means in the metal electrode, the boundary between the metal electrode and the organic EL layer and the boundary between the metal electrode and the exterior of the metal electrode, therefore, the transparent electrode waveguide mode or the transparent substrate waveguide mode can be converted to the radiation mode and the light emitted from the organic EL layer can be extracted efficiently out of the metal electrode. For extracting the light emitted from the organic EL layer only from the metal electrode, the transparent substrate described above can be replaced with a substrate not transparent to the light emitted from the organic EL layer.

The mode conversion means 41 shown in FIG. 23 can be fabricated by two separate growth sessions during the process of forming the metal electrode 31 by vapor deposition or sputtering. The mode conversion means 41 shown in FIGS. 24 to 26, on the other hand, can be formed by etching the surface of the organic EL layer 32, then the metal electrode 31 is formed on the upper surface of the organic EL layer 32 thereby to fabricate the organic EL light-emitting device. The mode conversion means 41 shown in FIGS. 27 to 29 can be formed by etching the upper surface of the metal electrode 31 thereby to fabricate the organic EL light-emitting device. The organic EL light-emitting device according to the invention is not limited to the fabrication method described herein.

In the case where the transparent substrate is formed of glass, the mode conversion means in the glass can be formed of $TiO_2$, $ZrO_2$, chlorine-group polymer or bromine-group polymer of rutile type higher in refractive index than glass. The chlorine-group polymer and the bromine-group polymer are transparent to the light emitted from the organic EL layer and therefore the light transmission loss can be reduced. Also, the mode conversion means can be formed of nanoporous glass or an organic material of fluorine group lower in refractive index than glass. These materials are transparent to the light emitted from the organic EL layer, and therefore the light transmission loss can be reduced. Further, the mode conversion means can be formed of a gas low in refractive index. The air or an inert gas is a desirable gas. The mode conversion means can be formed easily by producing bubbles of the ambient gas while fabricating the glass substrate in the atmosphere of the air or the inert gas.

In the case where the transparent electrode is formed of ITO, IZO, $SnO_2$, $In_2O_3$ or ZnO, the mode conversion means in the transparent electrode can be formed of $TiO_2$ or $ZrO_2$ of rutile type higher in refractive index than the transparent electrode. Also, the mode conversion means can be formed of nanoporous glass or fluorine-group organic material lower in refractive index than the transparent electrode. These materials are transparent to the light emitted from the organic EL layer, and therefore the light transmission loss can be reduced. Further, the mode conversion means formed of a material such as a gas low in refractive index. The air or an inert gas is a desirable gas. The mode conversion means can be formed easily by producing bubbles of the ambient gas while fabricating the transparent electrode in the atmosphere of the air or the inert gas.

In the case where the organic EL layer is formed of PVK or $Alq_3$, the mode conversion means in the organic EL layer can be formed of $TiO_2$, $ZrO_2$ of rutile type, chlorine-group polymer or bromine-group polymer higher in refractive index than the organic EL layer. The chlorine-group polymer and bromine-group polymer are transparent to the light emitted from the organic EL layer, and therefore the light transmission loss can be reduced. Also, the mode conversion means can be formed of nanoporous glass or a fluorine-group organic material lower in refractive index than the organic EL layer. These materials are transparent to the light emitted from the organic EL layer, and therefore the light transmission loss can be reduced. Further, the mode conversion means can be formed of a gas that is a material low in refractive index. The air or an inert gas is a desirable gas. The mode conversion means can be formed easily by producing bubbles of the ambient gas while forming the organic EL layer in the atmosphere of the air or the inert gas.

In order to mechanically protect or prevent the oxidization or humidification of the metal electrode layer and the organic EL layer of the organic EL light-emitting device, a transparent insulating film is formed effectively as a protective film on the outside of the metal electrode layer. An example of the organic EL light-emitting device having the transparent insulating film is shown in FIGS. 30 to 36. In FIGS. 30 to 36, numeral 31 denotes a metal electrode, 32 an organic EL layer, 33 a transparent electrode, 34 a transparent substrate, 35 a transparent insulating film as a protective film and 41 mode conversion means. The organic EL light-emitting devices shown in FIGS. 30, 31, 32 correspond to the organic EL light-emitting device shown in FIGS. 27, 28, 29, respectively, on which the transparent insulating film 35 is formed. These transparent insulating films 35 protect the metal electrode 31 or the organic EL layer 32. The transparent insulating film is formed not only in this case, but by forming the transparent insulating film on the outside of the metal electrode of the organic EL light-emitting device described above, the metal electrode is protected. These transparent insulating films can be formed by sputtering, vapor deposition, vapor deposition polymerization, electron beam evaporation, plasma deposition, ion plating, CVD, plasma CVD, thermal CVD, etc. using such a material as $SiO_x$, $SiN_x$, SiON, SiC, $Al_2O_3$, AlN, ZnO, $MgO_x$, $TiO_x$, ZrO, $AlO_x$, $Ta_2O_5$, $TaO_x$, $YO_x$ or $WO_x$. The transparent insulating film can also be formed by coating or spin coating epoxy resin, acryl resin, polyparaxylene, fluorine-group polymer or polyimide antecedent, followed by setting under ultraviolet curing procedure.

In the case where the transparent insulating film functions as a waveguide layer, the mode conversion means can be formed in the transparent insulating film or the boundary between the transparent insulating film and the adjacent layer or the like. The organic EL light-emitting devices shown in FIGS. 30, 31, 32 all have the mode conversion means 41 in the boundary between the metal electrode 31 and the transparent insulating film 35. The mode conversion means 41 may have a regularity of a refractive index distribution in the one-dimensional or two-dimensional direction. The organic EL light-emitting device shown in FIG. 33 has a mode conversion means 41 in the transparent insulating film. This mode conversion means 41 may have a regularity of a refractive index distribution in the one-dimensional, two-dimensional or the three-dimensional direction.

These mode conversion means may be formed in the boundary between the transparent insulating film and the exterior thereof as well as at the positions indicated in FIGS. 30 to 33. The organic EL light-emitting devices shown in FIGS. 34, 35, 36 all have the mode conversion means 41 in the boundary between the transparent insulating film 35 and the exterior thereof. The mode conversion means 41 may have a regularity of a refractive index distribution in the one-dimensional or two-dimensional direction.

In the organic EL light-emitting device having the transparent insulating film, as shown in FIGS. 30 to 36, the provision of the mode conversion means in the boundary between the metal electrode and the transparent insulating film, the interior of the transparent insulating film and the boundary between the transparent insulating film and the exterior thereof can convert the waveguide mode to the radiation mode in the transparent insulating layer or the waveguide layer including the transparent insulating layer, so that the light emitted from the organic EL layer can be extracted out of the transparent insulating film or the transparent substrate efficiently. Especially, in the organic EL light-emitting device of what is called the top emission type, by replacing the metal electrode with a translucent electrode, the provision of the mode conversion means in the transparent insulating film and/or the translucent electrode improves the emission efficiency even more.

For conversion from the waveguide mode to the radiation mode, the organic EL light-emitting device may further include an optical function layer having a mode conversion means outside the metal electrode or the second electrode or outside the transparent insulating film as a protective layer. Especially, in the organic EL light-emitting device of top emission type, the light emitted from the organic EL layer is emitted from the side of the metal electrode, the second electrode or the transparent insulating film. By providing the mode conversion means also in the optical function layer and the boundary of the optical function layer, the light in waveguide mode is converted to the radiation mode and emitted out of the organic EL light-emitting device. An optical film can be used as an optical function layer. The optical film can also effectively prevent the contact with the electrode or the physical damage to the organic EL light-emitting device. Incidentally, the optical function layer is not limited to the optical film but may be any transparent material that can form a waveguide layer.

Figure 37:
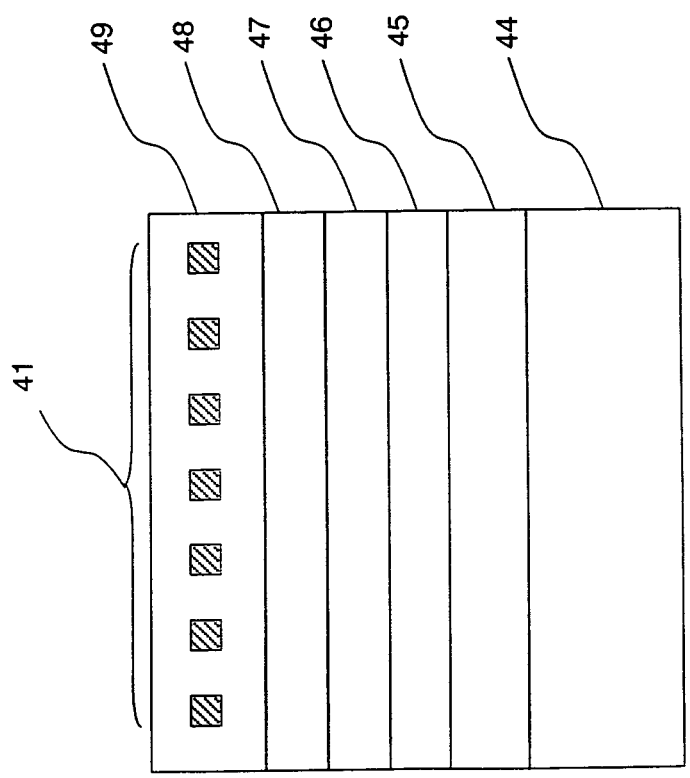
FIG. 37 is a diagram for explaining an example with the mode conversion means built in an optical film.
Figure 38:
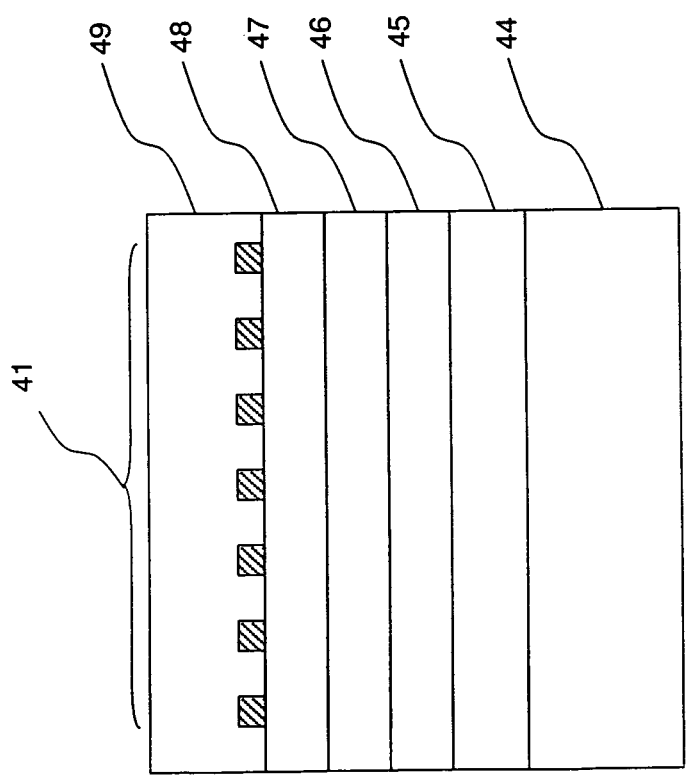
FIG. 38 is a diagram for explaining an example of the organic EL light-emitting device with the mode conversion means built in the boundary between the optical film and the transparent insulating film.
Figure 39:
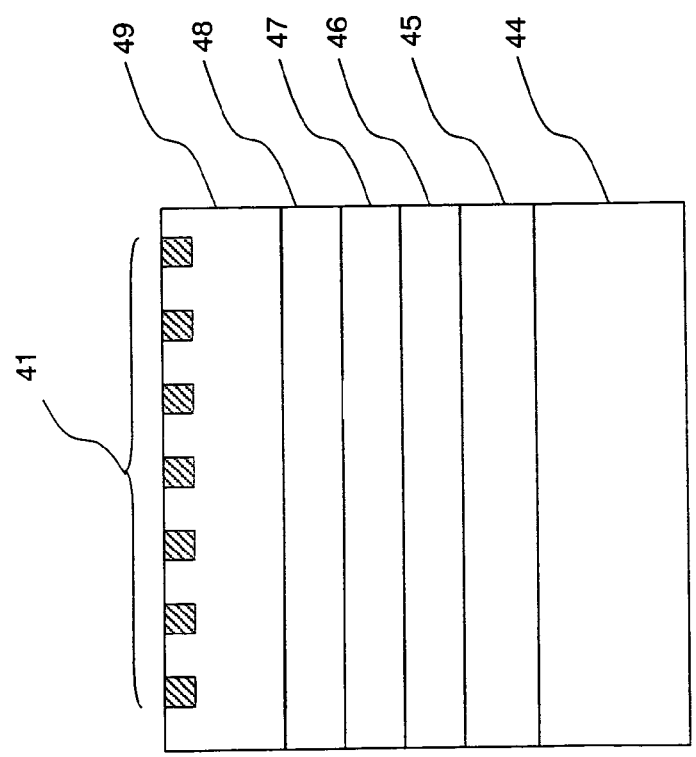
FIG. 39 is a diagram for explaining an example of the organic EL light-emitting device with the mode conversion means built in the boundary between the optical film and the exterior of the optical film.

An example of the organic EL light-emitting device of top emission type having an optical film is shown in FIGS. 37 to 39. In FIGS. 37 to 39, numeral 41 denotes a mode conversion means, 44 a substrate, 45 a first electrode, 46 an organic EL layer, 47 a second electrode, 48 a transparent insulating film as a protective film, and 49 an optical film. The organic EL light-emitting device shown in FIG. 37 has the mode conversion means 41 in the optical film. The mode conversion means may have a regularity of a refractive index distribution in the one-dimensional, two-dimensional or the three-dimensional direction. In FIGS. 38, 39, the mode conversion means 41 is arranged in the boundary of the optical film, and may have a regularity of a refractive index distribution either in the one-dimensional direction or in the two-dimensional direction. The organic EL light-emitting device shown in FIG. 38 may be the organic light-emitting device shown in FIGS. 34 to 36 with the optical film 49 added thereto. The mode conversion means 41 formed in the boundary between the optical film 49 of FIG. 39 and the exterior thereof may alternatively be formed in the inner portion, the intermediate portion or the outer portion of the optical film of the boundary.

The organic EL light-emitting device may further include an optical function layer having a mode conversion means on the outside of the substrate or the transparent substrate to covert the waveguide mode to the radiation mode. Especially, in the organic EL light-emitting device of bottom emission type in which the light emitted from the organic EL layer is radiated from the substrate or the transparent substrate, the mode conversion means is provided also in the optical function layer and the boundary of the optical function layer. In this way, the light that has assumed the waveguide mode is converted into the radiation mode and emitted out of the organic EL light-emitting device. An optical film is applicable as an optical function layer. The optical film effectively prevents the contact with the substrate or the transparent substrate and the physical damage to the organic EL light-emitting device. Incidentally, the optical function layer is not limited to the optical film but may be formed of any other transparent material forming a waveguide layer.

Figure 40:
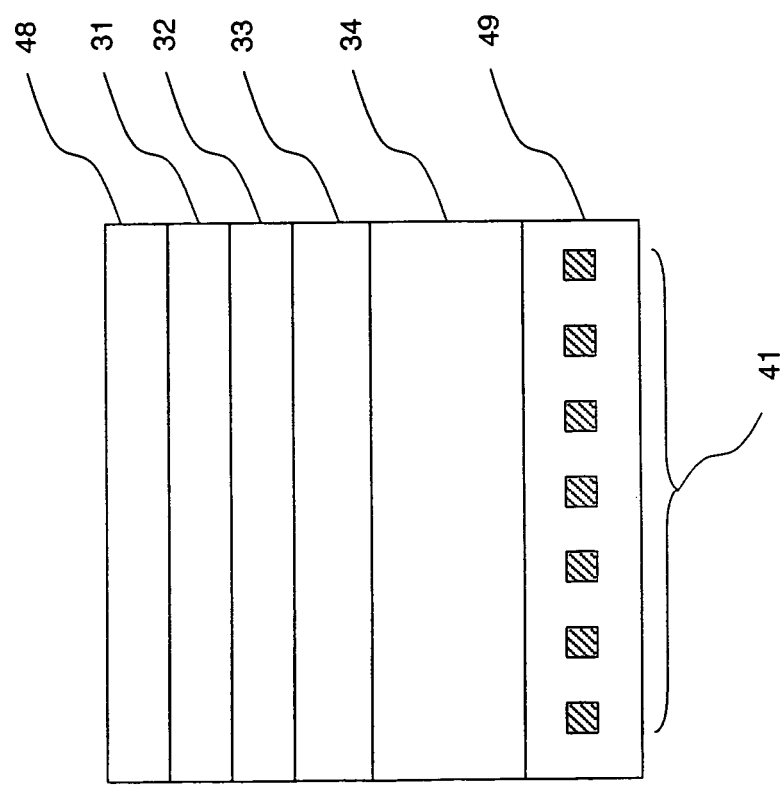
FIG. 40 is a diagram for explaining an example of the organic EL light-emitting device with the mode conversion means built in the optical film.
Figure 41:
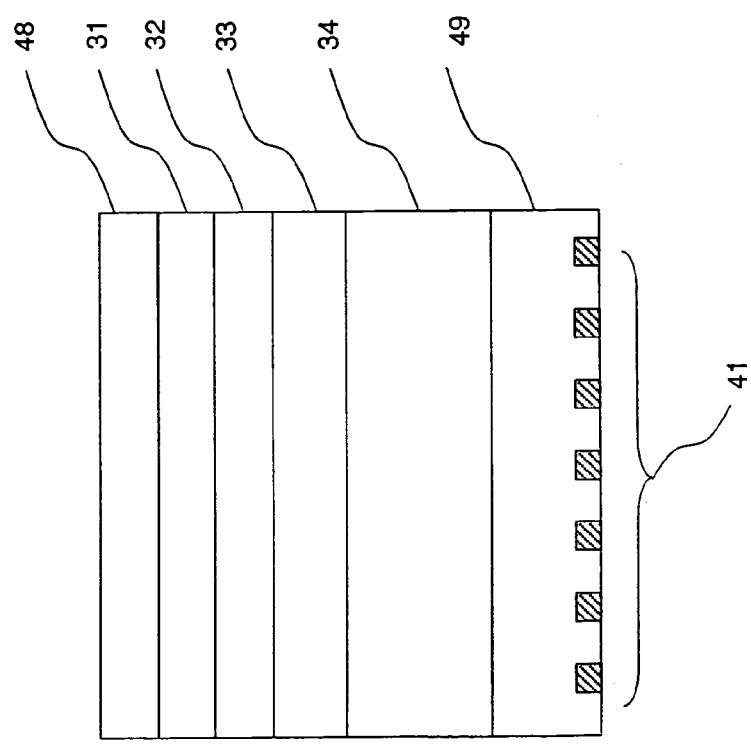
FIG. 41 is a diagram for explaining an example of the organic EL light-emitting device with the mode conversion means built in the boundary between the optical film and the exterior of the optical film.
Figure 42:
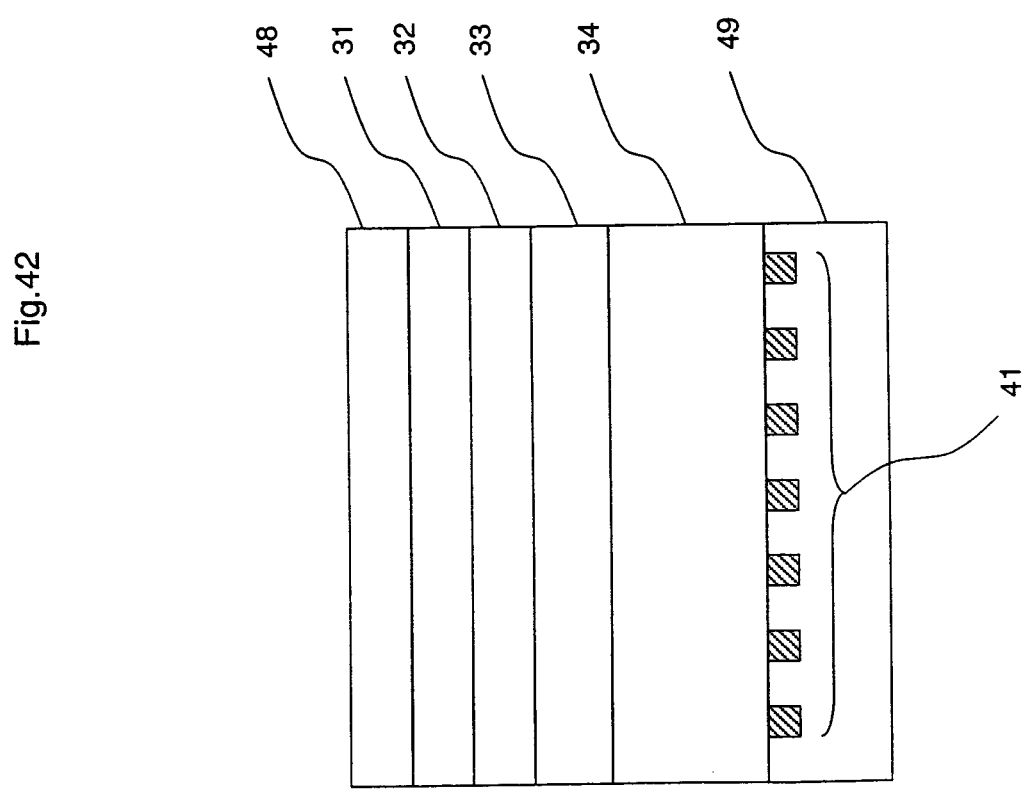
FIG. 42 is a diagram for explaining an example of the organic EL light-emitting device with the mode conversion means built in the boundary between the optical film and the transparent substrate.

An example of the organic EL light-emitting device of bottom emission type having an optical film is shown in FIGS. 40 to 42. In FIGS. 40 to 42, numeral 31 denotes a metal electrode, 32 an organic EL layer, 33 a transparent electrode, 34 a transparent substrate, 41 a mode conversion means, 48 a transparent insulating film as a protective film and 49 an optical film. The transparent insulating film 48 may or may not be included. In the organic EL light-emitting device shown in FIG. 40 which has the mode conversion means 41 in the optical film, the mode conversion means may have a regularity of a refractive index distribution in the one-dimensional, two-dimensional or three-dimensional direction. In FIGS. 41, 42, the mode conversion means 41 is arranged in the boundary of the optical film, and has a regularity of a refractive index distribution either in the one-dimensional or two-dimensional direction. The mode conversion means 41 formed in the boundary between the optical film 49 and the exterior thereof in FIG. 41 may alternatively be formed on the inner portion, the intermediate portion or the outer portion of the optical film in the boundary. The organic EL light-emitting device shown in FIG. 42 may be the organic EL light-emitting device of FIGS. 12 to 14 with the optical film 49 added thereto.

This optical film can be formed by coating or spin coating PMMA (polymethylmethacrylate), TAC (triacetate), PVA (polyvinyl alcohol), PC (polycarbonate), acryl, polyethylene terephthalate, polyvinylene, triacetyl cellulose, cyclo olefin, UV cured resin or liquid crystal polymer, or any of these materials can be formed on the organic EL light-emitting device by heating or with an adhesive after being formed into a sheet by biaxial orientation, casting or extrusion. The mode conversion means inside or in the boundary of the optical film can be formed by photolithography, soft lithography, UV inprinting or transfer.

The soft lithography is a method in which a die coated with resin is pressed against an object to form an etching pattern. The UV inprinting is a method in which a die coated with a UV cured resin is pressed against the object and radiated with ultraviolet light to set the UV cured resin and form an etching pattern.

In the organic EL light-emitting device having the optical film, the provision of the mode conversion means in the boundary or the interior of the optical film as shown in FIGS. 37 to 42 can convert the waveguide mode to the radiation mode in the optical film or in the waveguide layer including the optical film, so that the light emitted from the organic EL layer can be efficiently extracted outside of the optical film.

Figure 43:
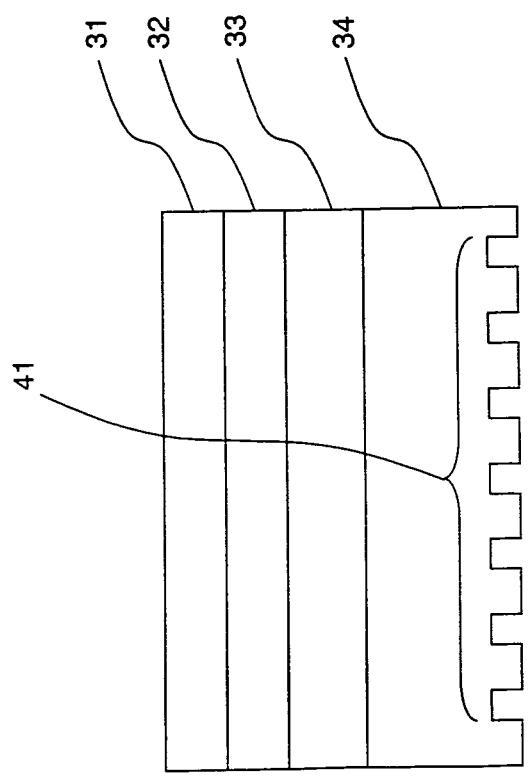
FIG. 43 is a diagram for explaining an example of the organic EL light-emitting device with the mode conversion means built in the boundary between the transparent substrate and the exterior of the transparent substrate.

Next, an example in which the optical structure having a regularity of a refractive index distribution as a mode conversion means is formed of an unevenness in the boundary having a regularity in the one-dimensional or two-dimensional direction is explained with reference to FIGS. 43 to 52. In FIGS. 43 to 47, numeral 31 denotes a metal electrode, 32 an organic EL layer, 33 a transparent electrode, 34 a transparent substrate and 41 a mode conversion means. FIG. 43 shows an example in which the mode conversion means 41 is arranged in the boundary between the transparent substrate 34 and the exterior of the transparent substrate 34. This optical structure is obtained by etching, nano inprinting or transfer of the transparent substrate 34. In the case where the outside of the transparent substrate is air, the same effect is obtained as if the optical structure having a regularity of a refractive index distribution making up the mode conversion means is formed of air. By providing the mode conversion means in the boundary between the transparent substrate and the exterior of the transparent substrate, the transparent substrate waveguide mode can be converted to the radiation mode and the light emitted from the organic EL layer can be efficiently extracted out of the transparent substrate.

The nano inprinting is a technique in which an uneven die is pressed, under heat if required, against the flat surface of a substrate or a thin film thereby to transfer the unevenness of the die onto the substrate or the thin film, as the case may be. In the case where the UV cured resin is used for the substrate or the thin film, the ultraviolet light is radiated or what is called the soft lithography can be employed in which a polymer is transferred after being coated on the die in advance. The die is preferably formed of Si, SiC, Ni, etc. high in mechanical strength.

Figure 44:
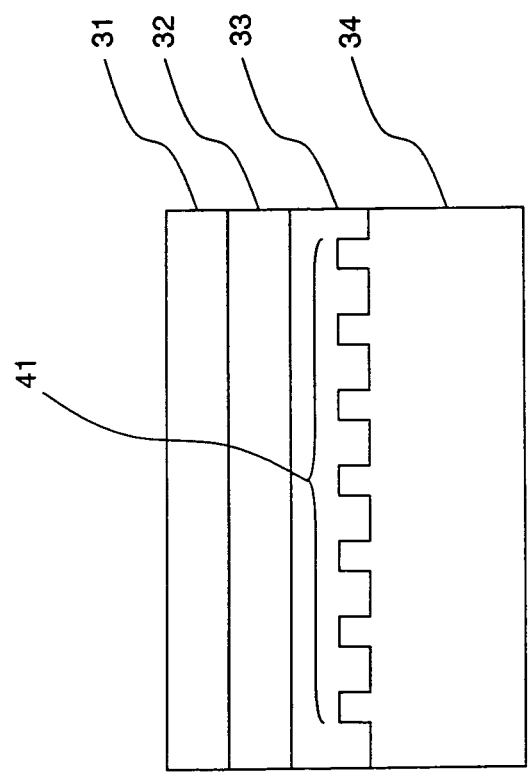
FIG. 44 is a diagram for explaining an example of the organic EL light-emitting device with the mode conversion means built in the boundary between the transparent electrode and the transparent substrate.

FIG. 44 shows an example in which the mode conversion means is arranged in the boundary between the transparent electrode 33 and the transparent substrate 34. This optical structure is obtained by forming an unevenness on the transparent substrate 34 by etching, nano inprinting, soft lithography or transfer and then laminating the transparent electrode 33 on the unevenness. Generally, the refractive index of the transparent electrode is higher than that of the transparent substrate, and this difference of refractive index makes it possible to form the optical structure having a regularity of a refractive index distribution. By arranging the mode conversion means in the boundary between the transparent electrode and the transparent substrate, the transparent substrate waveguide mode and the transparent electrode waveguide mode can be converted to the radiation mode, and the light emitted from the organic EL layer can be efficiently extracted out of the transparent substrate.

Figure 45:
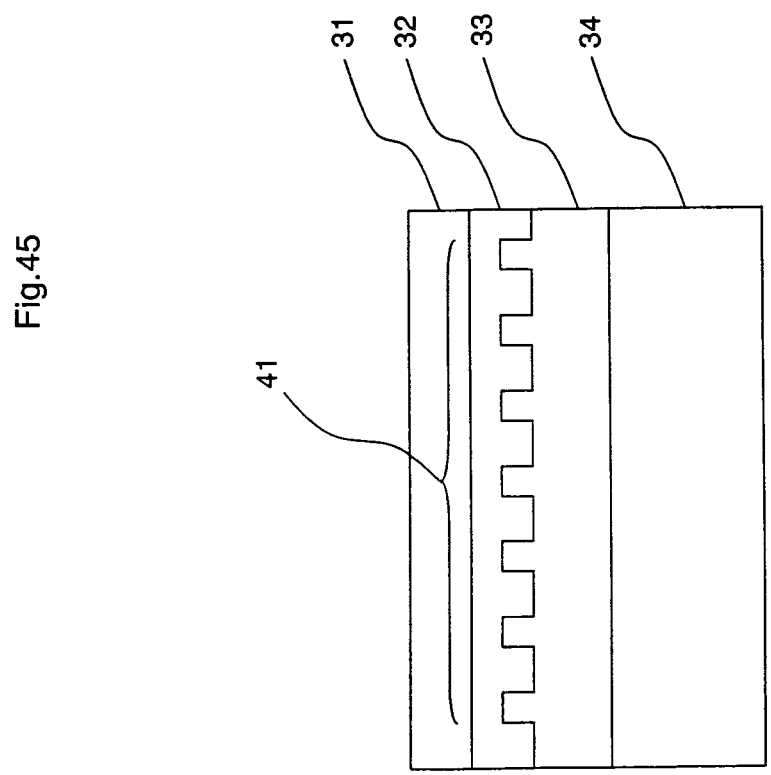
FIG. 45 is a diagram for explaining an example of the organic EL light-emitting device with the mode conversion means built in the boundary between the transparent electrode and the organic EL layer.

FIG. 45 shows an example in which the mode conversion means is arranged in the boundary between the transparent electrode 33 and the organic EL layer 32. This optical structure is obtained by forming an unevenness on the transparent electrode 33 by etching, nano inprinting, soft lithography or transfer and then laminating the organic EL layer 32 on the unevenness. Generally, the refractive index of the transparent electrode is higher than that of the organic EL layer, and this difference of refractive index makes it possible to form the optical structure having a regularity of a refractive index distribution. By arranging the mode conversion means in the boundary between the organic EL layer and the transparent electrode, the transparent electrode waveguide mode and the transparent substrate waveguide mode can be converted to the radiation mode, and the light emitted from the organic EL layer can be efficiently extracted out of the transparent substrate. In the case of the organic EL light-emitting device of bottom emission type, the mode conversion means is arranged in the boundary between the transparent electrode and the organic EL layer. Also in this case, the optical structure is obtained by etching or nano inprinting the transparent electrode, and after thus forming an unevenness, laminating the organic EL layer on the unevenness.

Figure 46:
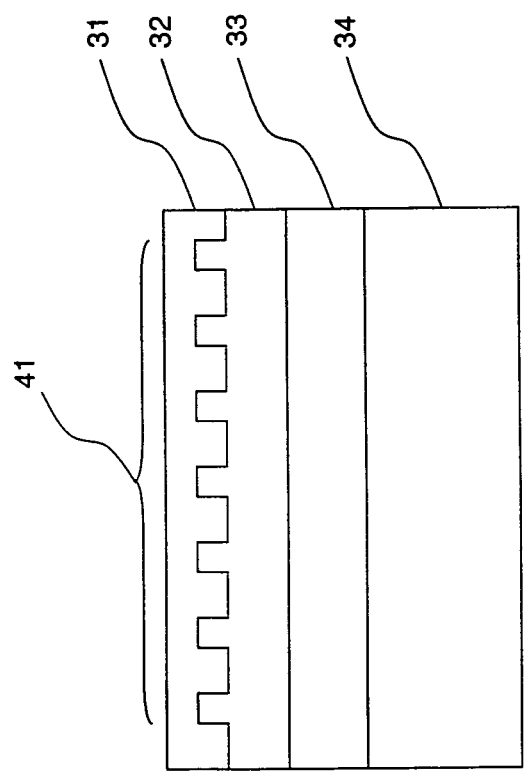
FIG. 46 is a diagram for explaining an example of the organic EL light-emitting device with the mode conversion means built in the boundary between the organic EL layer and the metal electrode.

FIG. 46 shows an example in which the mode conversion means is arranged in the boundary between the organic EL layer 32 and the metal electrode 31. In the case where the metal electrode is laminated thicker than the area having the evanescent wave, the metal functions as a reflector. By forming an unevenness on the surface of this reflector, an optical structure having a refractive index distribution can be formed. The provision of the mode conversion means in the boundary between the organic EL layer and the metal electrode can convert the transparent electrode waveguide mode and the transparent substrate waveguide mode to the radiation mode so that the light emitted from the organic EL layer can be efficiently extracted out of the transparent substrate.

Also, by forming the metal electrode 31 as a thin layer, the light emitted from the organic EL layer 32 can be efficiently extracted from the metal electrode 31 side by the mode conversion means arranged in the boundary between the organic EL layer and the metal electrode. The light can be also extracted efficiently from the metal electrode 31 side by a laminated structure including a translucent oxide such as ITO and a metal thin film having a low work function such as Al or Li into which electrons can be easily injected. Further, also in the case where the metal electrode is replaced by the transparent electrode as a second electrode, the light can be efficiently extracted by the mode conversion means arranged in the boundary. This unevenness can be obtained by forming an uneven surface on the organic EL layer by etching, nano inprinting, soft lithography or transfer and then laminating the metal electrode or the second electrode on the uneven surface.

In this way, the provision of the mode conversion means in the boundary between the metal electrode or the second electrode and the organic EL layer can convert the transparent electrode waveguide mode and the transparent substrate waveguide mode to the radiation mode, so that the light emitted from the organic EL layer can be efficiently extracted out of the metal electrode. Incidentally, when the light emitted from the organic EL layer is extracted only from the metal electrode side, a substrate not transparent to the light emitted from the organic EL layer can be used in place of the transparent substrate described above.

Figure 47:
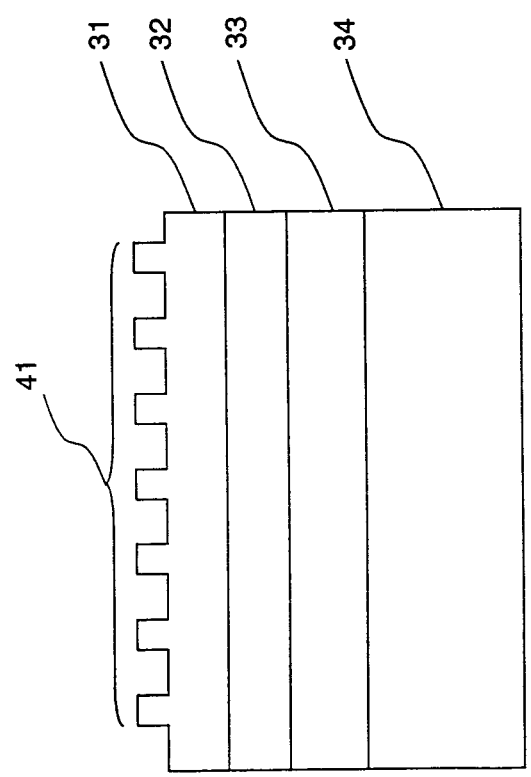
FIG. 47 is a diagram for explaining an example of the organic EL light-emitting device with the mode conversion means built in the boundary between the metal electrode and the exterior of the metal electrode.

FIG. 47 shows an example in which the mode conversion means is arranged in the boundary between the metal electrode 31 and the exterior of the metal electrode 31. The metal electrode is laminated to have the thickness equal to or smaller than the area having the evanescent wave, and the surface of the metal electrode 31 is processed by etching, nano inprinting or transfer. Then, the optical structure having a refractive index distribution can be formed. This optical structure can function as a mode conversion means by the exudation of the light in waveguide mode from the organic EL layer 32. In this way, the provision of the mode conversion means in the boundary between the metal electrode and the exterior of the metal electrode can convert the transparent electrode waveguide mode and the transparent substrate waveguide mode to the radiation mode, so that the light emitted from the organic EL layer can be efficiently extracted out of the transparent substrate.

Also, by forming the metal electrode 31 in a thin layer, the light emitted from the organic EL layer 32 can be extracted from the metal electrode 31 side. Further, the light can be also extracted from the metal electrode 31 side by a laminated structure including a translucent oxide such as ITO and a metal thin film having a low work function such as Al or Li into which electrons can be easily injected. Furthermore, the light can be efficiently extracted by the mode conversion means arranged in the boundary by replacing the metal electrode with the transparent electrode as the second electrode.

In this way, the provision of the mode conversion means in the boundary between the metal electrode and the exterior of the metal electrode or between the second electrode and the exterior of the second electrode can convert the transparent electrode waveguide mode and the transparent substrate waveguide mode to the radiation mode, so that the light emitted from the organic EL layer can be efficiently extracted out of the metal electrode or the second electrode.

Figure 48:
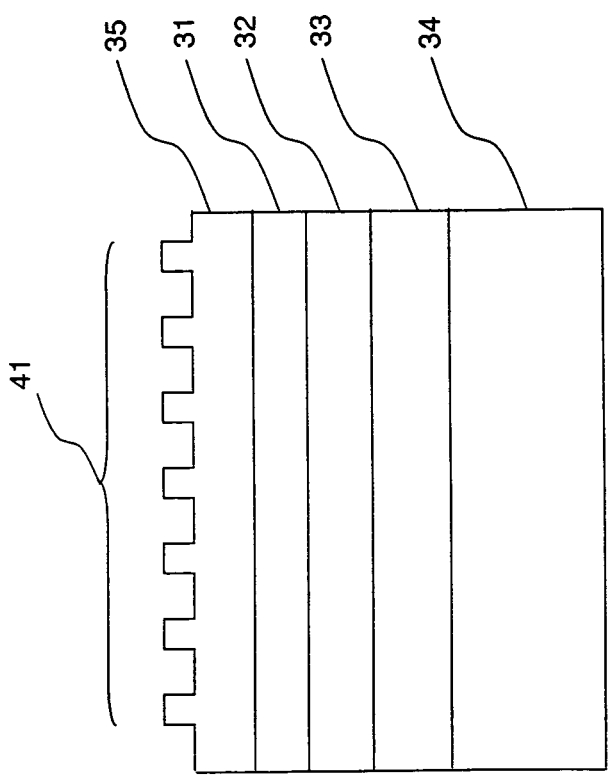
FIG. 48 is a diagram for explaining an example of the organic EL light-emitting device with the mode conversion means built in the boundary between the transparent insulating film and the exterior of the transparent insulating film.

Also in the organic EL light-emitting device shown in FIGS. 45 to 47, the metal electrode or the second electrode and the organic EL layer can be protected by forming a transparent insulating film as a protective film on the outside of the metal electrode or the second electrode. Also, in the case where the transparent insulating film functions as a waveguide layer in the organic EL light-emitting device having the transparent insulating film on the outside of the metal electrode or the second electrode, as shown in FIG. 48, the mode conversion means can be arranged in the boundary between the transparent insulating film and the exterior thereof. In FIG. 48, numeral 31 denotes a metal electrode, 32 an organic EL layer, 33 a transparent electrode, 34 a transparent substrate, 35 a transparent insulating film, and 41 a mode conversion means. In the organic EL light-emitting device having the transparent insulating film on the outside of the metal electrode or the second electrode, the mode conversion means can be arranged in the boundary between the transparent insulating film and the exterior thereof. The optical structure having a regularity of a refractive index distribution as a mode conversion means is formed of an unevenness in the boundary having a regularity in the one-dimensional or two-dimensional direction. The boundary unevenness having a regularity can be formed on the surface of the transparent insulating film 35 by etching, nano inprinting, soft lithography or transfer.

The provision of the mode conversion means in the boundary between the transparent insulating film and the exterior thereof can convert the waveguide mode to the radiation mode in the transparent insulating film or in the waveguide layer including the transparent insulating film, thereby making it possible to efficiently extract the light from the organic EL layer out of the transparent insulating film or the transparent substrate.

Figure 49:
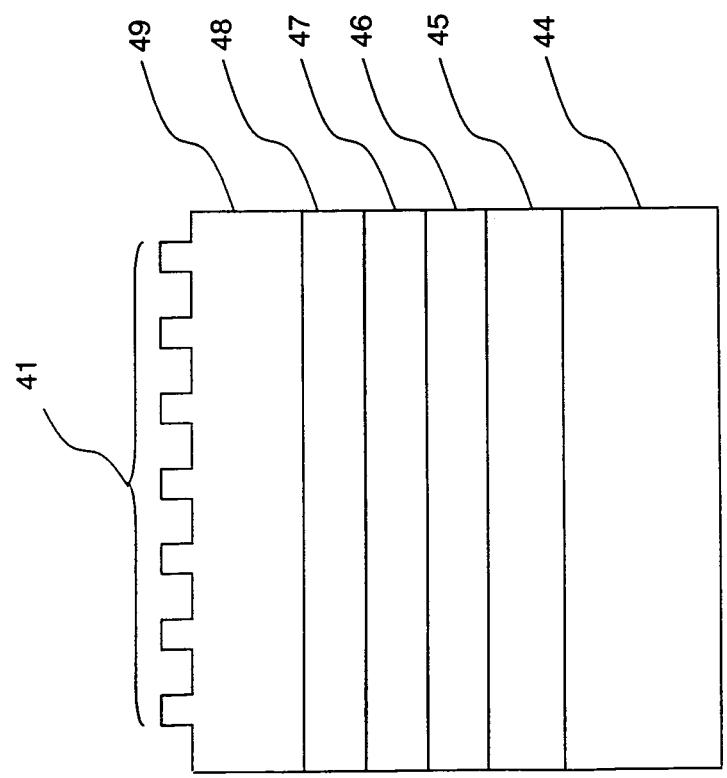
FIG. 49 is a diagram for explaining an example of the organic EL light-emitting device with the mode conversion means built in the boundary between the optical film and the exterior of the optical film.

In the organic EL light-emitting device of what is called the top emission type, in order to extract the light from the side far from the substrate, an optical film may be arranged as an optical function layer on the outside of the second electrode or the transparent insulating film. The optical film can also make up a waveguide layer, and therefore the mode conversion means is preferably formed of an unevenness having a regularity in the one-dimensional or two-dimensional direction in the boundary between the optical film and the exterior of the optical film. FIG. 49 shows an example of the organic EL light-emitting device having a regular unevenness in the boundary between the optical film and the exterior of the optical film. In FIG. 49, numeral 41 denotes a mode conversion means, 44 a substrate, 45 a first electrode, 46 an organic EL layer, 47 a second electrode, 48 a transparent insulating layer as a protective film, and 49 an optical film. In FIG. 49, the transparent insulating film 48 may or may not be included.

In the organic EL light-emitting device of what is called the top emission type, in order to extract the light from the side far from the substrate, an optical film is arranged as an optical function layer on the outside of the second electrode or the transparent insulating film, and the mode conversion means is formed of an unevenness having a regularity in the one-dimensional or two-dimensional direction in the boundary between the optical film and the exterior of the optical film. Thus, the waveguide mode can be converted to the radiation mode and the light emitted from the organic EL layer can be efficiently extracted out of the optical film.

Figure 50:
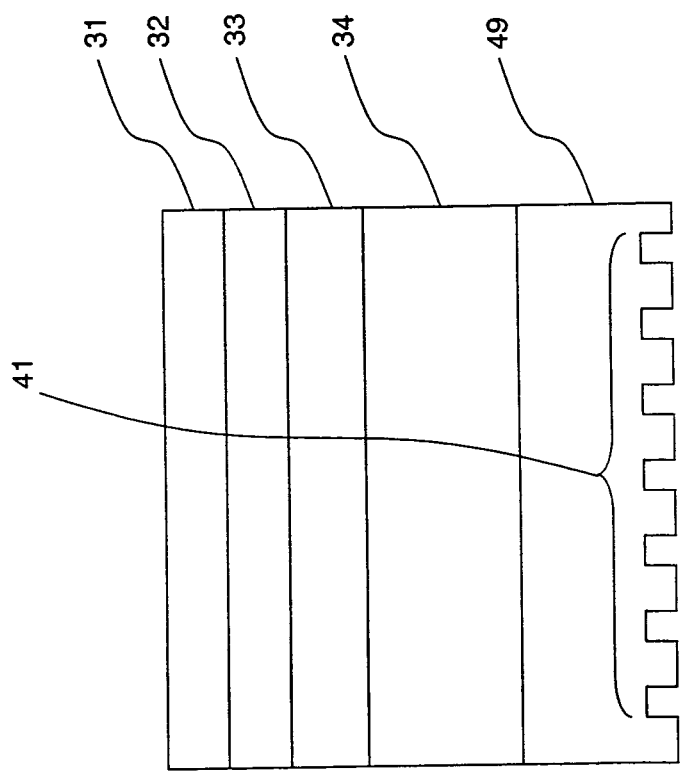
FIG. 50 is a diagram for explaining an example of the organic EL light-emitting device with the mode conversion means built in the boundary between the optical film and the exterior of the optical film.

In the organic EL light-emitting device of what is called the bottom emission type, in order to extract the light from the substrate side, an optical film may be arranged as an optical function layer on the outside of the substrate. The optical film can also make up a waveguide layer, and therefore the mode conversion means is preferably formed of an unevenness having a regularity in the one-dimensional or two-dimensional direction in the boundary between the optical film and the exterior of the optical film. FIG. 50 shows an example of the organic EL light-emitting device having a regular unevenness in the boundary between the optical film and the exterior of the optical film. In FIG. 50, numeral 41 denotes a mode conversion means, 34 a transparent substrate, 33 a transparent electrode, 32 an organic EL layer, 31 a metal electrode and 49 an optical film. In FIG. 50, the transparent insulating film may or may not be arranged on the outside of the metal electrode 31.

In the organic EL light-emitting device of what is called the bottom emission type, in order to extract the light from the substrate side, an optical film is arranged as an optical function layer on the outside of the substrate, and the mode conversion means is formed of an unevenness having a regularity in the one-dimensional or two-dimensional direction in the boundary between the optical film and the exterior of the optical film. Thus, the waveguide mode can be converted to the radiation mode and the light emitted from the organic EL layer can be efficiently extracted out of the optical film.

The mode conversion means shown in FIGS. 11 to 50 may be combined to provide two or more mode conversion means in the organic EL light-emitting device. The two or more mode conversion means may include optical structures having different regularities. The efficiency of the light extraction from the organic EL light-emitting device can be further improved by selecting the optimum structure for conversion from the waveguide mode to the radiation mode for each layer, or by the cooperation between the optical structures of different periods to efficiently convert the waveguide mode to the radiation mode.

Figure 51:
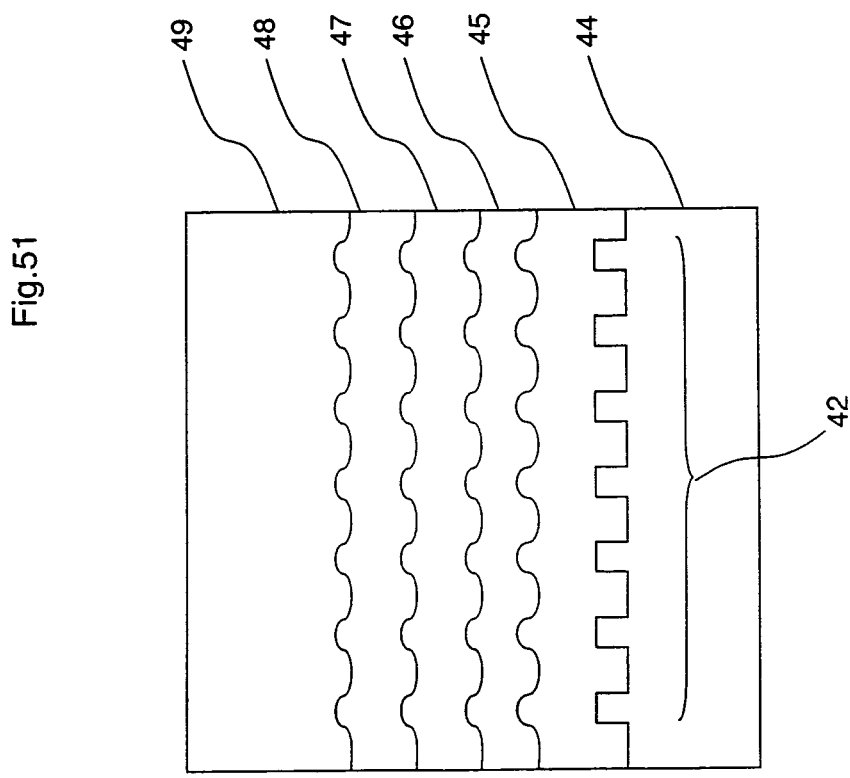
FIG. 51 is a diagram for explaining an example of the organic EL light-emitting device with the mode conversion means built in the boundary between the substrate and the first electrode.

The provision of an unevenness or the formation of an unevenness due to the refractive index distribution in a different material in the boundary between the substrate and the first electrode may result in the unevenness being transferred to the layer formed on the upper surface thereof. An example in which an unevenness is transferred is shown in FIG. 51. In FIG. 51, numeral 42 denotes a mode conversion means arranged in the boundary between the substrate and the first electrode, 44 a substrate, 45 a first electrode, 46 an organic EL layer, 47 a second electrode, 48 a transparent insulating film and 49 an optical film. An unevenness is formed on the upper surface of the substrate 44 by etching, nano inprinting or transfer. In the case where the first electrode 45 is laminated on the upper surface of the unevenness, the unevenness in the boundary between the substrate 44 and the first electrode 45 may be transferred to the boundary between the first electrode 45 and the organic EL layer 46. Such a transfer is caused in the case where the first electrode 45 is thin and laminated along the unevenness on the lower surface.

This transfer may occur not only to the boundary between the first electrode 45 and the organic EL layer 46 but also to the upper layers in some cases. Also, the unevenness formed in the interior or the boundary of another layer as well as the boundary between the substrate and the first electrode may extend to the layers formed on the upper surface thereof. This unevenness makes up an optical structure having a regularity of a refractive index distribution in the one-dimensional or two-dimensional direction, although the period is the same for all the layers. A different refractive index for each layer leads to a different effective wavelength for each layer. This is equivalent to the fact that each layer has a period with a fluctuation. Even in the case where the wavelength of the light emitted from the organic EL layer is spread, therefore, the light extraction efficiency of the organic EL light-emitting device is improved. Also, the directivity of the light extracted from the organic EL light-emitting device is relaxed.

Figure 52:
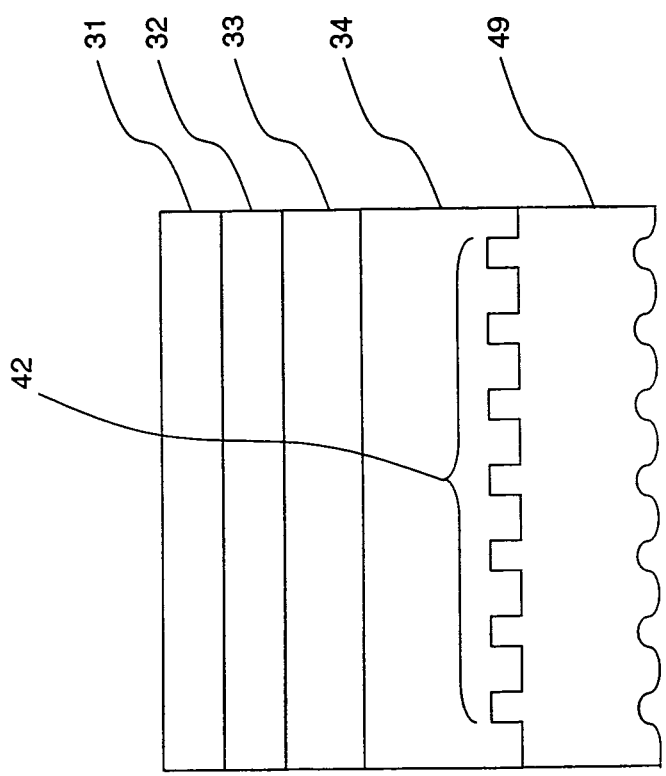
FIG. 52 is a diagram for explaining an example of the organic EL light-emitting device with the mode conversion means built in the boundary between the transparent substrate and the optical film.

The provision of an unevenness or the formation of an unevenness due to the refractive index distribution in a different material in the boundary between the substrate and the optical film as an optical function layer may result in the unevenness being transferred to the outer boundary of the optical film. An example in which an unevenness is transferred is shown in FIG. 52. In FIG. 52, numeral 31 denotes a metal electrode, 32 an organic EL layer, 33 a transparent electrode, 34 a transparent substrate, 42 a mode conversion means arranged in the boundary between the transparent substrate and the optical film, and 49 an optical film. An unevenness is formed on the outer surface of the transparent substrate 34 by etching, nano inprinting or transfer. In the case where the optical film is formed on the upper surface formed with the unevenness, the unevenness in the boundary between the transparent substrate 34 and the optical film 49 may be transferred to the boundary between the optical film 49 and the exterior of the optical film 49. This transfer is caused in the case where the optical film 49 is thin and formed along the unevenness on the transparent substrate.

Not only the unevenness formed in the boundary between the transparent substrate and the optical film but also the unevenness formed in the interior or the boundary of another layer may extend to the optical film. This unevenness makes up an optical structure having a regularity of a refractive index distribution in the one-dimensional or two-dimensional direction, although the period is the same for all the layers. A different refractive index for each layer leads to a different effective wavelength for each layer. This is equivalent to the fact that each layer has a period with a fluctuation. Even in the case where the wavelength of the light emitted from the organic EL layer is spread, therefore, the light extraction efficiency of the organic EL light-emitting device is improved. Also, the directivity of the light extracted from the organic EL light-emitting device is relaxed.

Figure 53:
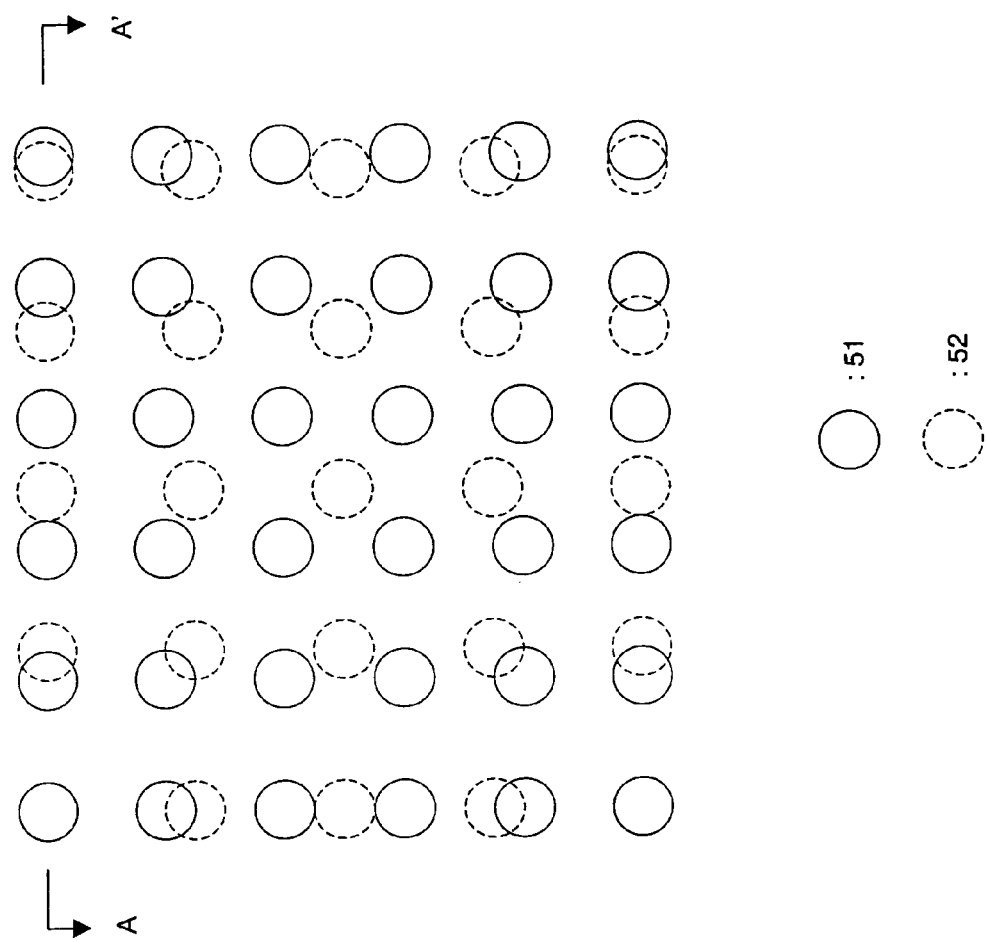
FIG. 53 is a plan view for explaining an example of the organic EL light-emitting device having two-stage mode conversion means.
Figure 54:
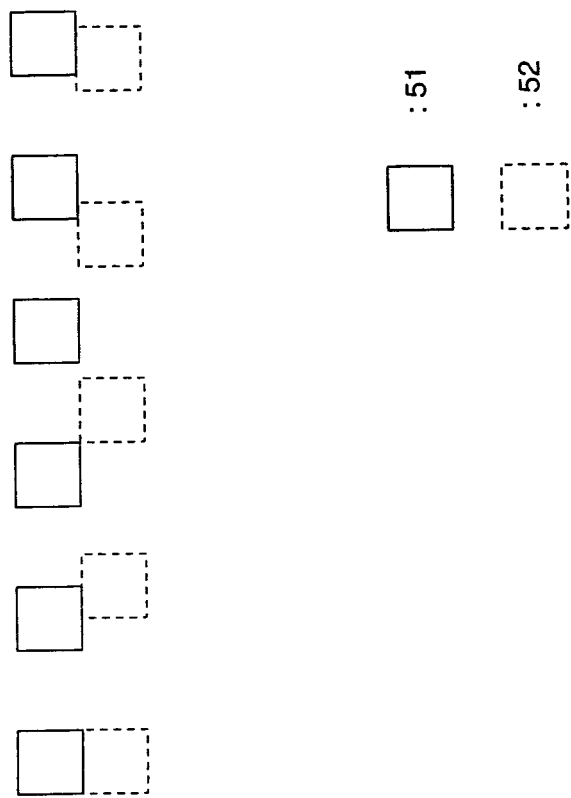
FIG. 54 is a cross sectional diagram for explaining an example of the organic EL light-emitting device having two stages of mode conversion means.

Two or more mode conversion means may be provided for the same layer. FIG. 53 is a perspective view, as taken from the direction perpendicular to the light-emitting surface, of the organic EL light-emitting device having two or more mode conversion means. FIG. 54 is a sectional view taken in line A-A in FIG. 53. In FIGS. 53, 54, numerals 51, 52 denote a mode conversion means. The other elements of the organic EL light-emitting device are not shown in FIGS. 53, 54. In FIGS. 53, 54, the first and second stages form different tetragonal lattices. For example, the first stage represents the effective wavelength in the vertical and lateral directions, while in the second stage, the effective wavelength is given in diagonal directions. The structure is not limited to the tetragonal lattice but may be a triangular lattice or a hexagonal lattice as described above. Also, the first and second stages may assume different shapes.

Although a laminated structure is shown in FIGS. 53, 54, the mode conversion means having different periods may be arranged in superposed relation on the same plane. In the case where two or more mode conversion means are arranged in the same layer, the optical structures of different periods cooperate to convert the waveguide mode to the radiation mode, thereby improving the light extraction efficiency of the organic EL light-emitting device even more, while at the same time relaxing the directivity of the extraction direction.

Figure 55:
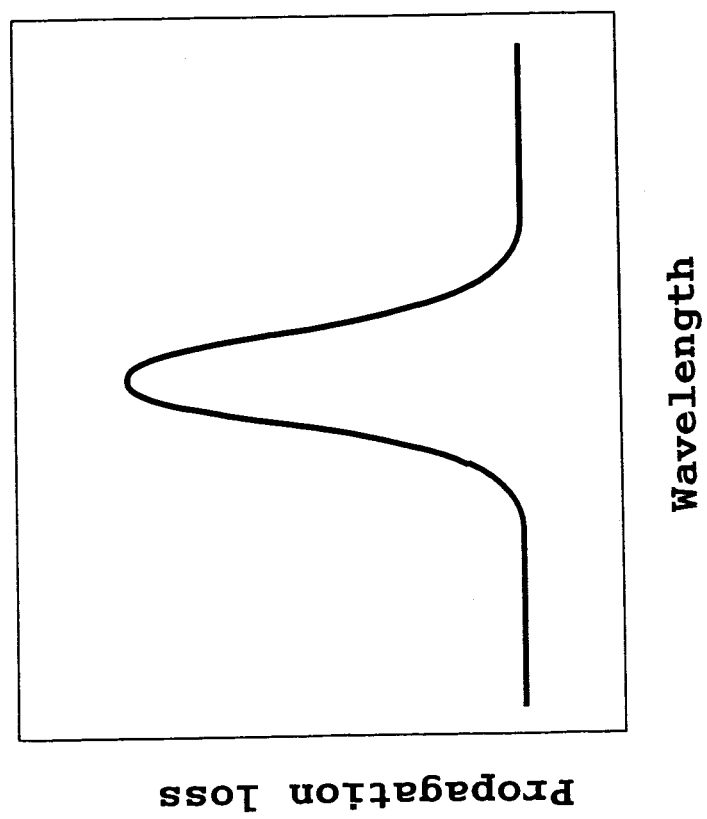
FIG. 55 is a diagram for explaining the propagation characteristics of the waveguide mode with an optical structure having a regularity of a refractive index distribution as a mode conversion means.

The propagation characteristic of the waveguide mode for the optical structure having a regularity of a refractive index distribution configured as a mode conversion means is shown in FIG. 55. In FIG. 55, the abscissa axis represents the wavelength and the longitudinal axis represents the propagation loss of the waveguide mode versus wavelength. Assuming that the period of the refractive index distribution is about the effective wavelength of the light, the propagation of the light having a specified wavelength is suppressed. In the wavelength suppressing the propagation, the waveguide mode is converted to the radiation mode, and therefore the propagation loss is increased for a specified wavelength as shown in FIG. 55. In the actual light-emitting device, however, the spread of the wavelength of the emitted light makes it necessary to expand the wavelength range in which the propagation is suppressed.

Figure 56:
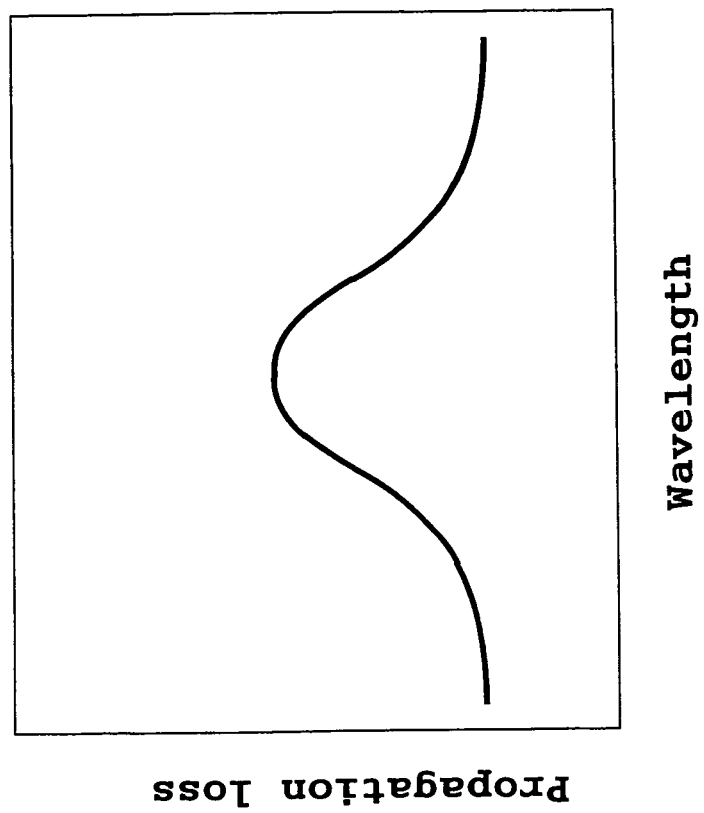
FIG. 56 is a diagram for explaining the propagation characteristics of the waveguide mode with a spread of wavelength suppressed in propagation.

In the case where a regular period has a fluctuation not more than one fourth of the period, for example, expands the wavelength range in which the propagation is suppressed. Assume that the wavelength characteristic of the light emitted from the light-emitting device in which the propagation is suppressed is as shown in FIG. 56. Even in the light-emitting device having a spread of the wavelength, the waveguide mode can be converted to the radiation mode for the emitted light. Also, the directivity of the light extracted from the organic EL light-emitting device can be relaxed.

Also, even in the case a regular period coexists with a fluctuation having a period not more than one fourth of the regular period, a similar effect is obtained. A similar effect can be obtained also in the case where the period undergoes a gradual change.

Figure 57:
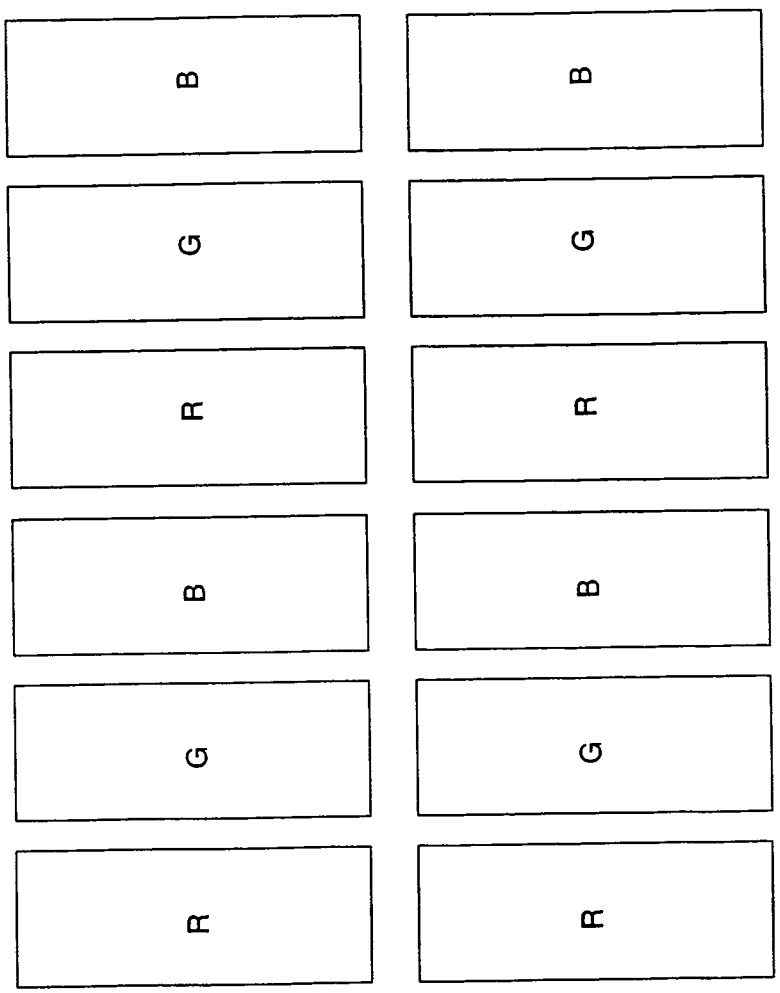
FIG. 57 is a diagram for explaining the pixels of a full-color display.

In an application of the organic EL light-emitting device to the color display, the organic EL layer is formed of a material corresponding to the light to be emitted. A general pixel configuration of the full-color display is shown in FIG. 57. In FIG. 57, the full-color display is made possible by the light emission from the pixels in the light-emitting areas of R, G, B arranged alternately. This full-color organic EL light-emitting device may have a mode conversion means as an optical structure of a common regularity of a refractive index distribution for R, G, B. In this case, the structure of the mode conversion means is not required to be varied between R, G, B.

On the other hand, each light-emitting area of R, G, B may have a regularity of a refractive index distribution corresponding to the wavelength of the emitted light. In this case, each light-emitting area has a period corresponding to the wavelength of the light emitted. Since the period is varied from one light-emitting area to another, the structure of the refractive index distribution is complicated. Nevertheless, the optimum structure can be obtained for the wavelength of the light emitted.

Next, a method of fabricating the organic EL light-emitting device according to the invention is explained. In this case, the mode conversion means is formed by nano inprinting on the surface of the substrate and/or the organic EL layer. First, the mode conversion means is formed by nano inprinting on the substrate surface. In the case where the substrate is a glass substrate, the die formed of Si or SiC is pressed against the glass substrate while being heated. The heating temperature is, for example, 150° C. for polymer and 350° C. for glass. The pressure is 1.5 N/mm$^2$ for polymer and 2.5 N/mm$^2$ for glass.

After forming an unevenness as a mode conversion means on the substrate surface, the substrate is cleaned to remove the unrequired foul. In the case where the substrate of Si is used, at least the surface formed with the organic EL light-emitting device is oxidized by hot steam. ITO or a metal to be the electrode is laminated by sputtering on the substrate. The thickness of the ITO or the metal to be the electrode is set to 100 to 150 nm. To pattern the ITO or the metal, a resist film is formed by spin coating. The resist film is formed of such a material as PMMA for the electron beam plotting described later. The thickness is 0.3 to 1 µm. The etching pattern is formed by photolithography or electron beam plotting. After forming the etching pattern, ITO or the metal is finished to an electrode pattern by etching. The plasma etching of inductively coupled type is preferable. After etching, the resist is removed. The oxygen plasma removal method or the solution removal method can be used for removing the resist.

An organic EL layer is formed on the upper surface of the ITO electrode or the metal electrode. Whenever required, in the organic. EL layer, a hole injection layer, a hole transport layer, an electron transport layer and an electron injection layer is laminated.

Examples of the material of the hole injection layer and the hole transport layer include pentacene, tetracene, anthracene, phthalocyanine, α-sexithiophene, α, ω-dihexyl-sexithiophene, oligophenylene, oligophenylenevinylene, dihexyl-anthradithiophene, bis(dithienothiophene), poly(3-hexylthiophene), poly(3-butylthiophene), poly(phenylenevinylene), poly(thienylenevinylene), polyacetylene, α, ω-dihexyl-quinquethiophene, TPD, α-NPD, m-MTDATA, TPAC, TCTA, polyvinylcarbazole, PDA, CuPc, STB, MTDATA, PEDOT-PSS or TPDPES-TBPAH.

Examples of the material of the electron injection layer and the electron transport layer, on the other hand, include $C_6$-PTC, $C_8$-PTC, $C_{12}$-PTC, $C_{13}$-PTC, Bu-PTC, $F_7$Bu-PTC#, Ph-PTC, $F_5$Ph-PTC#, PTCBI, PTCDI, TCNQ, $C_{60}$ fullerene, BCP, Alq$_3$, PBD, OXD, TAZ, TPOB, ZnPBO, BCP, OXD-7, Bphen, ZnPBO or the like phenanthroline derivative.

The method of laminating the organic EL layer includes the spin coating, vacuum vapor deposition, coating or ink jet method. The thickness of the lamination is 5 nm to 3000 nm. In the case where the mode conversion means is formed on the surface of the organic EL layer, the nano inprinting is a choice. The mode conversion means is heated and pressed against the organic EL layer. The heating temperature may be the room temperature. The pressure is 200 N/mm$^2$, for example.

The metal electrode or the ITO electrode is formed on the upper surface of the organic EL layer. The forming method is substantially similar to the method of forming the ITO electrode or the metal electrode on the substrate.

The transparent insulating layer is laminated as a protective film as required. These transparent insulating films can be formed of SiO$_x$, SiN$_x$, SiON, SiC, Al$_2$O$_3$, AlN, ZnO, MgO$_x$, TiO$_x$, ZrO$_x$, AlO$_x$, Ta$_2$O$_5$, TaO$_x$, YO$_x$ or WO$_x$ by sputtering, vapor deposition, vapor deposition polymerization, electron beam deposition, plasma deposition, ion plating, CVD, plasma CVD or thermal CVD. The transparent insulating layers can also be formed by coating or spin coating epoxy resin, acryl resin, polyparaxylene, fluorine-group polymer or polyimide antecedent, followed by UV setting.

In the case where the optical film is formed as an optical function element on the surface of the organic EL light-emitting device, PMMA (polymethylmethacrylate), TAC (triacetate), PVA (polyvinyl alcohol), PC (polycarbonate), acryl, polyethylene terephthalate, polyvinylene, triacetyl cellulose, cyclo olefin, UV cured resin or liquid crystal polymer is coated or spin coated into a sheet or formed into a sheet by biaxial orientation, casting or extrusion, followed by attaching with heat or adhesive, thereby forming an organic EL light-emitting device. The mode conversion means in the interior or the boundary of the optical film can be formed by photolithography, soft lithography or transfer.

INDUSTRIAL APPLICABILITY

This invention is applicable to the organic EL light-emitting device. Also, the light-emitting device according to the invention is applicable widely to a flat display device as well as an organic EL light-emitting device.

The invention claimed is:

1. An organic EL (electroluminescence) light-emitting device comprising:
  a structure including, arranged in this order, a substrate, a first electrode, an organic EL layer and a second electrode opposed to the first electrode; and
  an unevenness which has a period for converting a waveguide mode to a radiation mode and inhibiting a propagation of light in a waveguide mode, the unevenness arranged in a single one of an interior of the substrate, an interior of the first electrode, an interior of the organic EL layer, an interior of the second electrode, a boundary between the substrate and an exterior of the substrate, a boundary between the substrate and the first electrode, a boundary between the first electrode and the organic EL layer, a boundary between the organic EL layer and the second electrode and a boundary between the second electrode and an exterior of the second electrode, wherein
  the second electrode is a transparent electrode, an at least translucent thin film metal electrode or an electrode comprised of a transparent electrode and an at least translucent thin film metal arranged on a side of the transparent electrode nearest to the organic EL layer,
  the unevenness is an optical structure having a regularity of a refractive index distribution in a one-dimensional, two-dimensional or three-dimensional direction,
  a refractive index of an interior of the optical structure is different from a refractive index of a periphery of the optical structure,
  the regularity has a fluctuation of not more than one fourth of a period of an effective wavelength degree of the light emitted from the organic EL layer, and
  the unevenness has at least two optical structures with the regularity of the refractive index distribution in the two-dimensional direction, and the regularity of the optical structures has a different period within a fluctuation range for each optical structure.

2. The organic EL light-emitting device according to claim 1, comprising an optical function layer at the boundary between the substrate and the exterior of the substrate or at the boundary between the second electrode and the exterior of the second electrode having the unevenness for converting the waveguide mode to the radiation mode.

3. An organic EL (electroluminescence) light-emitting device comprising:
   a structure including, arranged in this order, a substrate, a first electrode, an organic EL layer and a second electrode opposed to the first electrode;
   at least one waveguide layer arranged on the substrate; and
   an unevenness which has a period for converting a waveguide mode to a radiation mode and inhibiting a propagation of light in the waveguide mode, the unevenness arranged in a single one of an interior of the substrate, an interior of the first electrode, an interior of the organic EL layer, an interior of the second electrode, an interior of the waveguide layer, a boundary between the substrate and an exterior of the substrate, a boundary between the substrate and the first electrode, a boundary between the first electrode and the organic EL layer, a boundary between the organic EL layer and the second electrode, a boundary between the second electrode and an exterior of the second electrode, a boundary between the substrate and the waveguide layer, a boundary between the first electrode and the waveguide layer, a boundary between the organic EL layer and the waveguide layer, a boundary between the second electrode and the waveguide layer, a boundary between the waveguide layer and an exterior of the waveguide layer and a boundary between the waveguide layer and another waveguide layer, wherein
   the second electrode is a transparent electrode, an at least translucent thin film metal electrode or an electrode comprised of a transparent electrode and an at least translucent thin film metal arranged on a side of the transparent electrode nearest to the organic EL layer,
   the unevenness is an optical structure having a regularity of a refractive index distribution in a one-dimensional, two-dimensional or three-dimensional direction,
   a refractive index of an interior of the optical structure is different from a refractive index of a periphery of the optical structure,
   the regularity has a fluctuation of not more than one fourth of a period of an effective wavelength degree of the light emitted from the organic EL layer, and
   the unevenness has at least two optical structures with the regularity of the refractive index distribution in the two-dimensional direction, and the regularity of the optical structures has a different period within a fluctuation range for each optical structure.

4. An organic EL (electroluminescence) light-emitting device comprising:
   a structure including, arranged in this order, a substrate, a first electrode, an organic EL layer, a translucent second electrode opposed to the first electrode and a protective film; and
   an unevenness which has a period for converting a waveguide mode to a radiation mode and inhibiting propagation of light in the waveguide, the unevenness arranged in a single one of an interior of the substrate, an interior of the first electrode, an interior of the organic EL layer, an interior of the second electrode, an interior of the protective film, a boundary between the substrate and an exterior of the substrate, a boundary between the substrate and the first electrode, a boundary between the first electrode and the organic EL layer, a boundary between the organic EL layer and the second electrode, a boundary between the second electrode and the protective film, and a boundary between the protective film and an exterior of the protective film, wherein
   the unevenness is an optical structure having a regularity of a refractive index distribution in a one-dimensional, two-dimensional or three-dimensional direction,
   a refractive index of an interior of the optical structure is different from a refractive index of a periphery of the optical structure,
   the regularity has a fluctuation of not more than one fourth of a period of an effective wavelength degree of the light emitted from the organic EL layer, and
   the unevenness has at least two optical structures with the regularity of the refractive index distribution in the two-dimensional direction, and the regularity of the optical structures has a different period within a fluctuation range for each optical structure.

5. The organic EL light-emitting device according to claim 4, comprising an optical function layer at the boundary between the substrate and the exterior of the substrate or the boundary between the protective film and the exterior of the protective film, the optical function layer having the unevenness for converting the waveguide mode to the radiation mode.

6. An organic EL (electroluminescence) light-emitting device comprising:
   a structure including, arranged in this order, a substrate, a first electrode, an organic EL layer, a translucent second electrode opposed to the first electrode and a protective film;
   at least one waveguide layer formed on the substrate; and
   an unevenness which has a period for converting a waveguide mode to a radiation mode arranged in a single one of an interior of the substrate, an interior of the first electrode, an interior of the organic EL layer, an interior of the second electrode, an interior of the protective film, an interior of the waveguide layer, a boundary between the substrate and an exterior of the substrate, a boundary between the substrate and the first electrode, a boundary between the first electrode and the organic EL layer, a boundary between the organic EL layer and the second electrode, a boundary between the second electrode and the protective film, a boundary between the protective film and an exterior of the protective film, a boundary between the substrate and the waveguide layer, a boundary between the first electrode and the waveguide layer, a boundary between the organic EL layer and the waveguide layer, a boundary between the second electrode and the waveguide layer, a boundary between the protective film and the waveguide layer, a boundary between the waveguide layer and an exterior of the waveguide layer and a boundary between the waveguide layer and another waveguide layer, wherein
   the unevenness is an optical structure having a regularity of a refractive index distribution in a one-dimensional, two-dimensional or three-dimensional direction,
   a refractive index of an interior of the optical structure is different from a refractive index of a periphery of the optical structure,
   the regularity has a fluctuation of not more than one fourth of a period of an effective wavelength degree of the light emitted from the organic EL layer, and the unevenness has at least two optical structures with the regularity of the refractive index distribution in the two-dimensional direction, and the regularity of the optical structures has a different period within a fluctuation range for each optical structure.

7. The organic EL light-emitting device according to any one of claims 1, 2-3 and 4-6, wherein the regularity is a period of an effective wavelength degree of the light emitted from the organic EL layer.

8. The organic EL light-emitting device according to any one of claims 1, 2-3 and 4-6, comprising two or more unevennesses which have a period having the regularity of a same period.

9. The organic EL light-emitting device according to any one of claims 1, 2-3 and 4-6, wherein the two or more optical structures are formed in the same two-dimensional plane.

10. The organic EL light-emitting device according to any one of claims 1, 2-3 and 4-6, wherein the regularity is such that a period of an effective wavelength degree of the light emitted from the organic EL layer coexists with a fluctuation of not more than one fourth of the period of the effective wavelength degree.

11. The organic EL light-emitting device according to any one of claims 1, 2-3 and 4-6, wherein a period of the regularity changes gradually.

12. The organic EL light-emitting device according to any one of claims 1, 2-3 and 4-6, wherein the regularity of the refractive index distribution in the two-dimensional direction is a tetragonal lattice arrangement, a triangular lattice arrangement, a honeycomb lattice arrangement, an arrangement which can fill up a plane with a finite number of unit elements or any combination thereof.

13. The organic EL light-emitting device according to any one of claims 1, 2-3 and 4-6, wherein the refractive index of the interior of the optical structure is higher than the refractive index of the periphery of the optical structure.

14. The organic EL light-emitting device according to claim 13, wherein the optical structure is transparent to the light emitted from the organic EL layer.

15. The organic EL light-emitting device according to any one of claims 1, 2-3 and 4-6, wherein the refractive index of the interior of the optical structure is lower than the refractive index of the periphery of the optical structure.

16. The organic EL light-emitting device according to claim 15, wherein the optical structure is transparent to the light emitted from the organic EL layer.

17. The organic EL light-emitting device according to claim 15, wherein the unevenness includes a material having a low refractive index of a gas.

18. The organic EL light-emitting device according to claim 17, wherein the gas is an air or an inert gas.

19. The organic EL light-emitting device according to any one of claims 1, 2-3 and 4-6, wherein the optical structure is formed of an unevenness of a boundary having the regularity in the one-dimensional or two-dimensional direction.

20. The organic EL light-emitting device according to any one of claims 1, 2-3 and 4-6, wherein the organic EL layer has a different emitted light wavelength depending on area.

21. The organic EL light-emitting device according to claim 20, wherein the unevenness is the optical structure having the regularity of the refractive index distribution in the one-dimensional, two-dimensional or three-dimensional direction corresponding to the different emitted light wavelength.

* * * * *